United States Patent [19]

Graybill et al.

[11] Patent Number: 5,371,499
[45] Date of Patent: Dec. 6, 1994

[54] DATA COMPRESSION USING HASHING

[75] Inventors: Mark D. Graybill, Agoura Hills; Donald R. Harris, Quartz Hill; Dean K. Gibson, Harbor City, all of Calif.

[73] Assignee: Intersecting Concepts, Inc., Agoura Hills, Calif.

[21] Appl. No.: 965,331

[22] Filed: Oct. 23, 1992

Related U.S. Application Data

[63] Continuation-in-part of Ser. No. 843,982, Feb. 28, 1992.

[51] Int. Cl.⁵ .............................................. H03M 7/30
[52] U.S. Cl. ........................................ 341/51; 341/67; 341/106
[58] Field of Search ...................... 341/51, 65, 87, 95, 341/106, 107; 395/425; 365/49, 230.03

[56] References Cited

U.S. PATENT DOCUMENTS

| | | |
|---|---|---|
| 3,914,586 | 10/1975 | McIntosh . |
| 3,976,844 | 8/1976 | Betz . |
| 4,021,782 | 5/1977 | Hoerning . |
| 4,054,951 | 10/1977 | Jackson et al. . |
| 4,087,788 | 5/1978 | Johannesson . |
| 4,295,124 | 10/1981 | Roybal . |
| 4,412,306 | 10/1983 | Moll . |
| 4,464,650 | 8/1984 | Eastman et al. . |
| 4,491,934 | 1/1985 | Heinz . |
| 4,538,240 | 8/1985 | Carter et al. . |
| 4,558,302 | 12/1985 | Welch . |
| 4,560,976 | 12/1985 | Finn . |
| 4,586,027 | 4/1986 | Tsukiyama et al. . |
| 4,588,985 | 5/1986 | Carter et al. . |
| 4,612,532 | 9/1986 | Bacon et al. . |
| 4,677,649 | 6/1987 | Kunishi et al. . |
| 4,682,150 | 7/1987 | Mathes et al. . |
| 4,701,745 | 10/1987 | Waterworth . |
| 4,730,348 | 3/1988 | MacCrisken . |
| 4,758,899 | 7/1988 | Tsukiyama . |
| 4,809,350 | 2/1989 | Shimoni et al. . |
| 4,814,746 | 3/1989 | Miller et al. . |
| 4,853,696 | 8/1989 | Mukherjee . |
| 4,872,009 | 10/1989 | Tsukiyama et al. . |
| 4,876,541 | 10/1989 | Storer . |
| 4,899,147 | 2/1990 | Schiavo ............................ 341/60 |
| 4,906,991 | 3/1990 | Fiala et al. . |
| 4,929,946 | 5/1990 | O'Brien et al. . |
| 4,961,139 | 10/1990 | Hong et al. ......................... 364/200 |
| 4,979,039 | 12/1990 | Kisor et al. . |
| 4,988,998 | 1/1991 | O'Brien . |
| 5,003,307 | 3/1991 | Whiting et al. . |
| 5,010,553 | 4/1991 | Scheller et al. . |
| 5,016,009 | 5/1991 | Whiting et al. . |
| 5,032,987 | 7/1991 | Broder et al. ....................... 364/200 |
| 5,049,881 | 9/1991 | Gibson et al. . |
| 5,129,074 | 7/1992 | Kikuchi et al. ..................... 395/425 |
| 5,132,992 | 7/1992 | Yurt et al. . |

FOREIGN PATENT DOCUMENTS 2152253A 10/1982 United Kingdom .

OTHER PUBLICATIONS

J. Cleary et al., "Data Compression Using Adaptive Coding and Partial String Matching", *IEEE Transactions on Communications*, 32:396–403 (1984).

M. Wells, "File Compression Using Variable Length Encodings", *The Computer Journal*, 15:308–313 (1972).

(List continued on next page.)

*Primary Examiner*—Brian K. Young
*Attorney, Agent, or Firm*—Merchant & Gould

[57] ABSTRACT

Compressing a sequence of characters drawn from an alphabet uses string substitution with no a priori information. An input data block is processed into an output data block comprised of variable length incompressible data sections and variable length compressed token sections. Multiple hash tables are used based on different subblock sizes for string matching, and this improves the compression ratio and rate of compression. The plurality of uses of the multiple hash tables allows for selection of an appropriate compression data rate and/or compression factor in relation to the input data. Using multiple hashing tables with a recoverable hashing method further improves compression ratio and compression rate. Each incompressible data section contains means to distinguish it from compressed token sections.

91 Claims, 10 Drawing Sheets

OTHER PUBLICATIONS

R. P. Brent, "A Linear Algorithm for Data Compression", *The Australian Computer Journal*, 19(2):64–67 (1987).

J. Ziv and A. Lempel, "A Universal Algorithm for Sequential Data Compression", *IEEE Transactions on Information Theory*, IT-23(3):337–343 (1977).

T. C. Bell, "Better OPM/L Text Compression", *IEEE Transactions on Communications*, CCOM-34(12):1176–1182 (1986).

D. W. Jones, "Application of Splay Trees to Data Compression", *Communications of the ACM*, 31(8):996–1007 (1988).

E. R. Fiala and D. H. Greene, "Data Compression with Finite Windows", *Communications of the ACM*, 32(4):490–505 (1989).

E. Goto et al., "Parallel Hashing Algorithms", *Information Processing Letters*, 6(1):8–13 (1977).

E. M. McCreight, "A Space-Economical Suffix Tree Construction Algorithm", *Journal of the ACM*, 23(2):262–272 (1976).

T. A. Welch, "A Technique for High Performance Data Compression", *IEEE Computer*, 8–19 (Jun. 1984).

M. Rodeh et al., "Linear Algorithm for Data Compression via String Matching", *Journal of the ACM*, 28(1):16–24 (1981).

V. S. Miller and M. N. Wegman, "Variations on a Theme by Ziv and Lempel", *Conference Record—International Conference on Communications*, (IEEE Service Center, Cat. No. 88CH2538-7) 390–394 (1984).

M. E. Gonzalez—Smith and J. A. Storer, "Parallel Algorithms for Data Compression", *Journal of the Assoc. for Computing Machinery*, 32(2):344–373 (1985).

Storer, J. A., *Data Compression: Methods and Theory*, Computer Science Press (1988).

Nelson, M., *The Data Compression Book*, M & T Books (1992).

Storer, J. A. and Reif, J. H. (ed.), *Data Compression Conference 1991*, IEEE Computer Society Press (1991).

Knuth, D. E., *Sorting and Searching, The Art of Computer Programming*, Chapter 6.4, vol. 3, pp. 506–542, Addison Wesley Publishing Co. (1973).

COMPRESSION FLOW

DECOMPRESSION FLOW

EXAMPLE HASH TABLE

DATA COMPRESSION USING HASHING

RELATED APPLICATION

This application is a continuation-in-part of U.S. Ser. No. 843,982 filed February 28, 1992. The contents of this application are incorporated by reference herein.

BACKGROUND

Compressing digital input data into output data at a high compression ratio and high compression rate is increasingly valuable for efficiently operating computers, transmitting and transferring data over communication channels, and for storing data.

This invention relates to compressing a stream of input data into a compressed stream of output data. In particular, the system is for use, for instance, with computers, modems, data storage techniques, and data transmission and display.

Lossless data compression involves the process of transforming a body of data to a typically smaller representation from which the original can be reconstructed at a later time. Thus data that is compressed and then subsequently decompressed must always be identical to the original.

Ideally, data compression should be at a high compression ratio and/or a high compression rate. The use of a minimum amount of storage and steps to effect compression usually is required to achieve these objectives.

The input data for compression is represented as a sequence of characters drawn from some alphabet. An alphabet is a finite set containing at least one element. The elements of an alphabet are characters. A string over an alphabet is a sequence of characters, each of which is an element of that alphabet.

A common approach to compressing a string of characters is textual substitution. A textual substitution data compression method compresses text by identifying repeated substrings and replacing some substrings by references to other copies. Such a reference is commonly known as a pointer and the string to which the pointer refers is called a target. Therefore, in general, the input to a data compression method employing textual substitution is a sequence of characters over some alphabet and the output is a sequence of characters from the alphabet interspersed with pointers.

Various data compression systems are known which utilize special purpose compression methods designed for compressing special classes of data. The major drawback to such systems is that they only work well with the special class of data for which they were designed and are inefficient when used with other types of data.

Processing the input data is effected by viewing the input data in minimum subblock sizes. Thus, the input data can be considered in subblock sizes of three, four or other suitable number of bytes of input data at any one time. The determination of the correct input data subblock size impacts the rate and ratio of data compression.

One known compression technique is the Lempel-Ziv method. One such method maps variable-length segments of symbols into various length binary words. A problem with this method is that the required memory space grows at a non-linear rate with respect to the input data.

Dictionaries

An improved variation of the Lempel-Ziv method uses a created dictionary technique. This method requires the creation of a searchtree database. The amount of achievable compression is heavily dependent on the dictionary. Management and searching of the dictionary is time consuming, yielding low data rate-compression factor product.

A different Lempel-Ziv method uses a tree node type structure. An input stream of data character signals is stored in a string table as strings of data character signals encountered in the input stream. This has the additional disadvantage of requiring more storage.

Hashing

Other systems of compressing data use different techniques, such as a history array means to act as a separate dictionary of input data and an offset array means as a supportive linking table to a hash table. By using a history array means, additional memory and processing time is needed, thereby also relatively reducing the compression ratio and the rate of compression.

A hash table technique for compressing data has been described in U.S. Pat. No. 5,049,881 (Gibson et al.), the contents of which are incorporated by reference herein. Hashing avoids the need of a dictionary as used in the Lempel-Ziv methods described above. Hashing is a mechanism where input data is processed in terms of any selected mathematical procedure to produce a hash key, which is the hash table address to a hash entry, which provides storage of hash information in a hash table. Hashing permits storage and retrieval of data items quickly, since the data stored in the hash table is essentially quickly indexed by a mathematical function of the data. This procedure permits for an increased rate of data compression. A hash key represents any one of a hash table address, hash table index, or a pointer to the head of a hash information list for conditional replacement, or a pointer to hash table entry which is unconditionally replaced. One or more hash table entries are referenced by each hash table key, with each entry containing hash information to identify and locate strings in the input data.

While the original Lempel-Ziv method effects a relatively high compression ratio, its rate of compression is relatively low compared to the hash table technique of U.S. Pat. No. 5,049,881, which achieves a higher rate of compression, but at a relative loss of compression ratio. The present invention improves on the compression ratio while simultaneously improving the data rate over known hash table techniques.

SUMMARY

By this invention, there is provided a highly effective system, method and apparatus for compression of data using hashing. Such invented system achieves both a high ratio and a high rate of data compression.

According to the invention, a string of input data is compressed into a stream of output data through the use of multiple hashing using at least two hash tables, each respectively for a different input data subblock size. A string of input characters of input data is hashed for each of the two different data subblock sizes to produce respective hash table keys. The hashed information respectively is entered into the hash table references by these hash keys or key chains of the respective hash tables. Subsequent strings of data of each of the respective subblock sizes are hashed to produce respective hash keys.

Searching for a hash match is effected in at least one of the hash tables. If a hash match occurs, the matching length of subsequent occurrence of the string and the backwards distance to the string is outputted as compressed data. If a hash match does not occur, at least the first character of the data subblock is outputted as uncompressed data.

In a preferred form of the invention, a hash key for at least one of the hash tables is obtained at least in part from a hash key from a second of the hash tables.

In one other preferred form of the invention, where a hash match occurs in a table related to a larger subblock size and a hash match occurs in a table related to a smaller subblock size, the hash match in the hash table of the larger subblock size is selected as the compressed data output.

In a different preferred form of the invention, where a hash match occurs for multiple hash tables, there is the determination of the longer match length of the string of input data for each respective hash table, and the longer match length is outputted as the compressed data.

In yet a further preferred situation, wherein the one subblock size is larger than the second subblock size, hash keys for the larger subblock size are computed using at least part of the hash key of the hash data from the smaller subblock size.

In another preferred aspect of the invention, wherein a larger subblock size does not match on the minimum match length, the smaller subblock hash key is selected where such smaller subblock key matches for its respective minimum length. When the hash match occurs in a table related to the larger subblock size relative to the hash match in a table related to the smaller subblock size, the hash match of the larger subblock size is selected as the compressed data output.

A further preferred different aspect of the invention relates to employing a hash key from a hash miss in a hash recovery method whereby a reduced number of operations is required for hashing. Such system is applicable for a single hash table or multiple hash tables. A hash miss is a situation where there is hash information at the entry referenced by the hash key referencing a prior string which does not match the current string, and therefore, no hash match occurs.

A further preferred different aspect of the invention reuses a hash key when no hashing match occurs to quickly compute new hash keys for the next input source location whereby a reduced number of operations is required for computing hash keys. Such system is applicable for a single hash table or multiple hash tables.

A further preferred aspect of the invention relates to selectively applying a matched hash from either the larger subblock hash or the smaller subblock hash for compressing the input data, the selection is effected in relation to the input data and a determination of at least one of whether the compression ratio and compression data rate is higher for compression with the larger subblock size match or the smaller subblock size match.

Either one or more of the hash tables can selectively retain at each key, hash information which can be only a source pointer to input data, or a pointer to hashed information which contains a source pointer and additional data. The entries in either one or both of the hash tables can be selectively unconditionally replaced or conditionally replaced or removed on the occurrence of subsequent hash keys being computed.

The invention is directed to subblock sizes, preferably of three for a first hash table and four for a second hash table.

The invention provides a method, apparatus and system for data compression. The use of multiple hashing tables provides for an enhanced compression ratio. The use of the hash recovery method provides an enhanced compression rate. The systems can be used independently or together. Both of these methods applied together provide a highly effective data compression ratio and data compression rate.

The invention is further described with reference to the accompanying drawings.

DRAWINGS

DESCRIPTION

Data Compression Through Multiple Hashing

Input data is scanned creating references to various input data subblock strings through the use of a multiple, recoverable, hashing function.

The following definitions are useful:

Hashing—The act of performing computations on an input data subblock to produce a hash table key.

Hash Table Entry—An occurrence of the hashed input data reference. May contain an input data source pointer or other information.

Hash Table—A collection of hash table entries, grouped together by common input data subblock size.

Hash Table Key—An index or index computed from an input subblock or index of data to locate one or more hash table entries likely to contain references to matching subblocks.

Hash Table Information —Contents of a hash table entry that references input data previously hashed.

Figure 8:
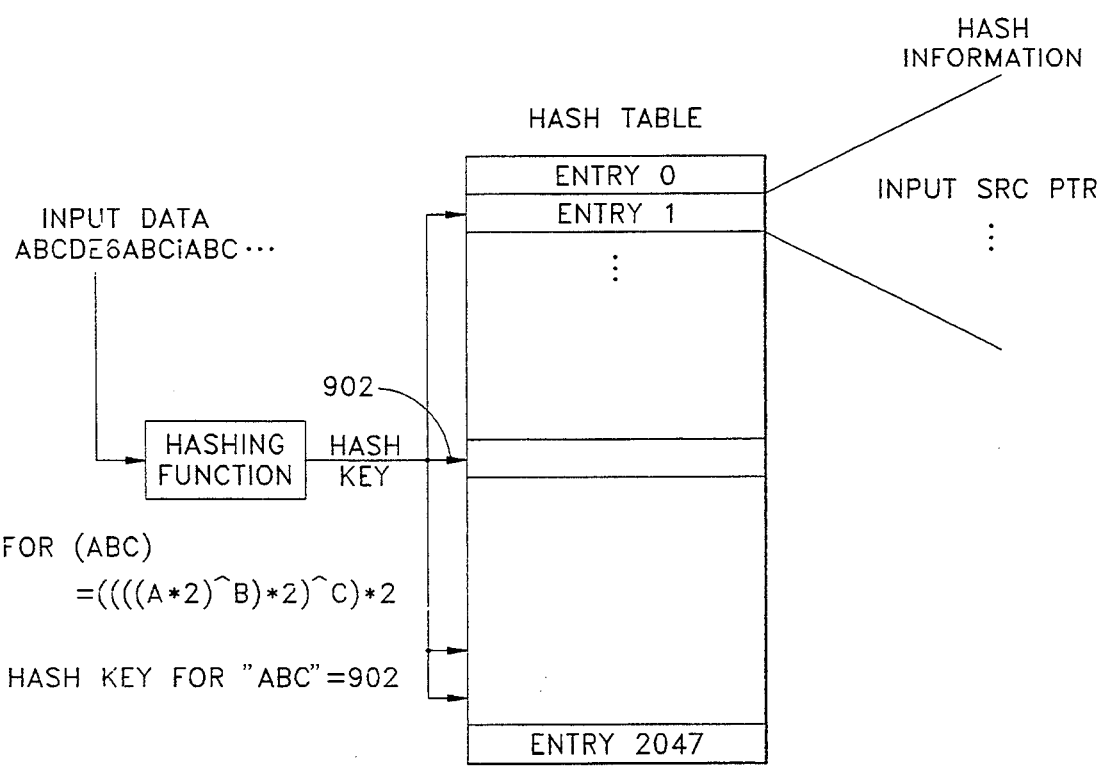
FIG. 8 is a block diagram illustrating an example hash table.

In FIG. 8 there is a hash table block diagram example illustrated with reference to these definitions. A typical hashing algorithm is illustrated for the string of input characters "ABC".

An example hash collision would be where a different hashed input data subblock would result in the same hash key value of 902. An example hash miss would by where the comparison of string "ABC" with a prior string pointed to be the input source pointer of the hash information contained at hash table entry referenced by key 902 does not match.

Different data subblock sizes are established for each hash table. As each input data subblock for each hash table is scanned, multiple checks for a prior occurrence of the same string are performed.

If a prior occurrence of a string of data is discovered, an encoding is effected and a compression token is stored in the output data block. The token contains, at a minimum, means to identify the output token, means to represent a backwards distance from the current string to the previous occurrence of the string, and means to represent a count of the number of matching characters in the two strings. This represents an output of the subsequent occurrences of the string as compressed data. If a hashed match of data for each of the minimum subblocks does not occur, the data is outputted as a string of uncompressed data.

Hashing of input data refers to the process of performing a series of mathematical operations on input data blocks of the selected subblock size to arrive at a result, or hash key which occupies less number of bits than the original input data subblock. In this manner, hash keys can be used with high probability to reference input data subblocks without using inordinate amounts of memory storage. Effective results are obtained with hash table total memory consumption of 1.5 kbytes.

References that are made in error, that is, when two different data subblocks hash to the same hash key, are called hash collisions. In general, hash computations are chosen as a design trade-off between computation complexity (time) and number of hash collisions. A hash "hit" means a string comparison match to a current input subblock and some prior input subblock referenced by the hash information stored in a hash entry referenced by a hash key. Likewise, a hash "miss" means a string comparison mismatch, or hash collision.

There are many suitable hashing techniques that can be used to effect the multiple hashing system. In general, hash computations which are more complex will offer a reduction of hash collisions (higher compression ratio) at the expense of compression rate. An appropriate selection of hashing technique can be made according to design criteria, such as whether data rate or compression has a higher priority in respect of each other. If the designee has a prior knowledge of the statistical distribution of the input data, a preferred selected hashing technique or algorithm can be used on that data.

The smallest hash subblock is chosen such that if a hash match occurs, and the match count is exactly the size of the subblock, then the number of bits used in the output block will be no more than the number of bits in the input data subblock. In this manner, the maximum growth when incompressible data is encountered is limited to a very low percentage.

Compression

Figure 1A:
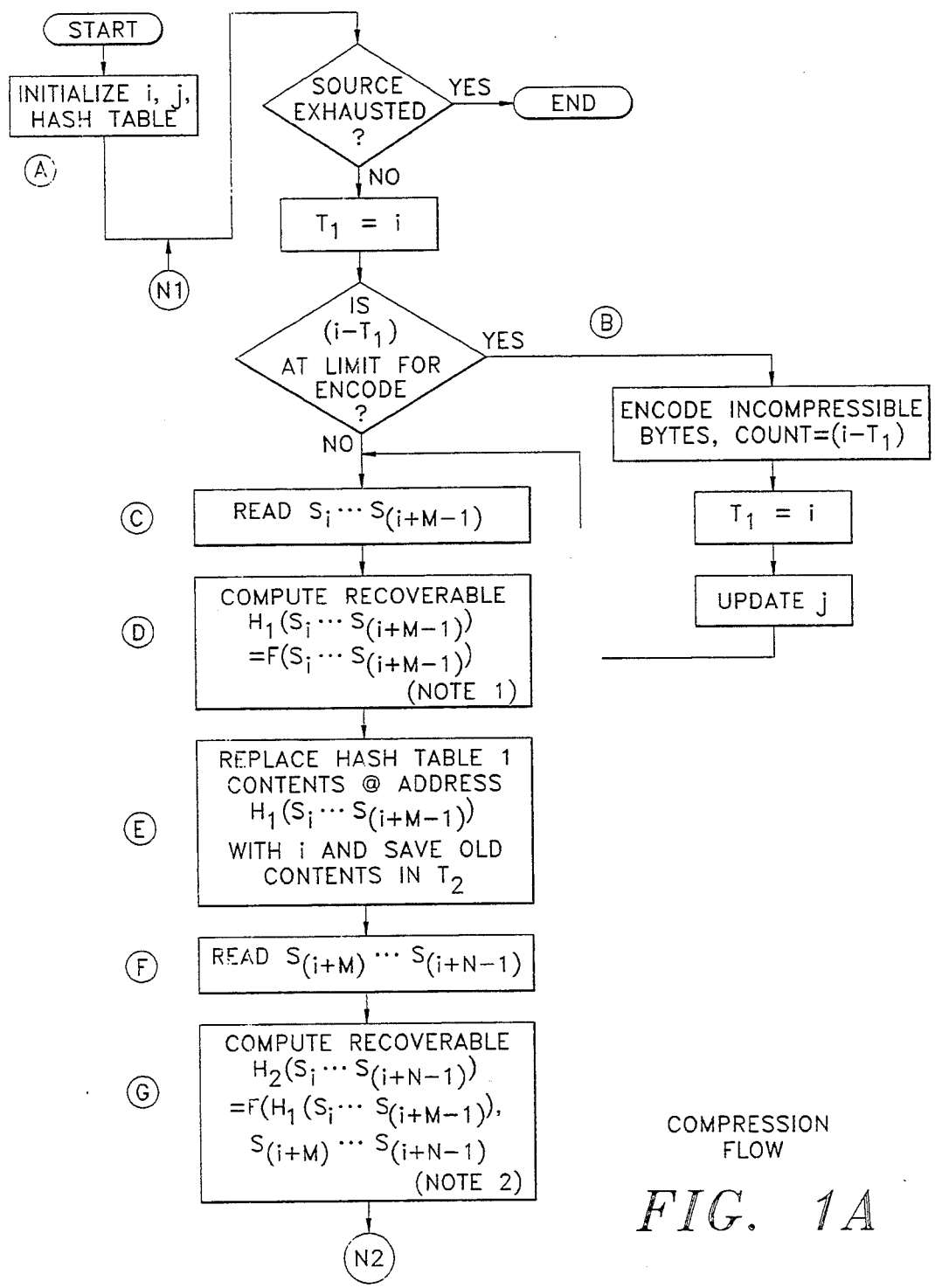
FIG. 1a–1c are flow diagrams of a compression method of the present invention utilizing two hash tables.
Figure 1B:
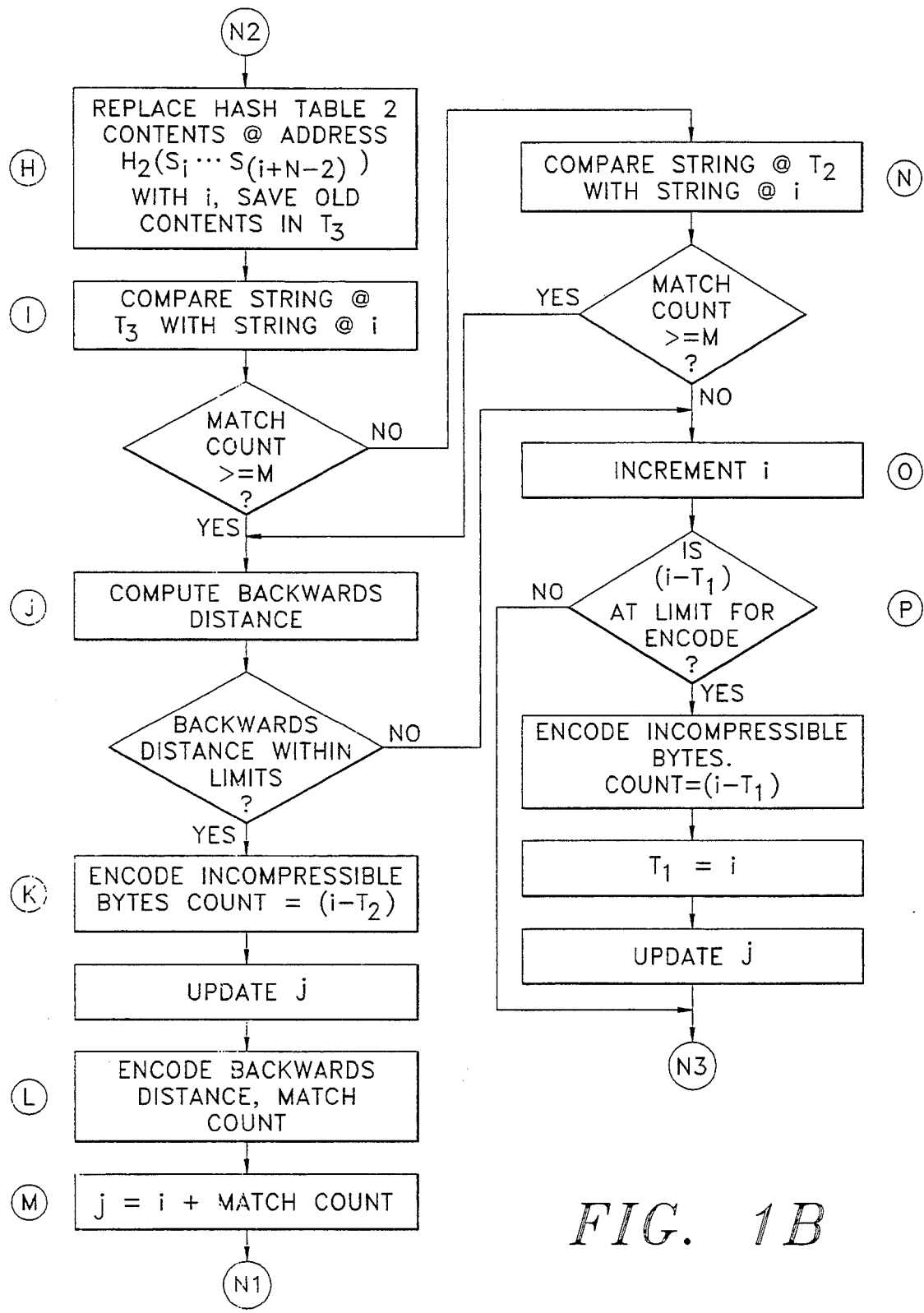
Figure 1C:
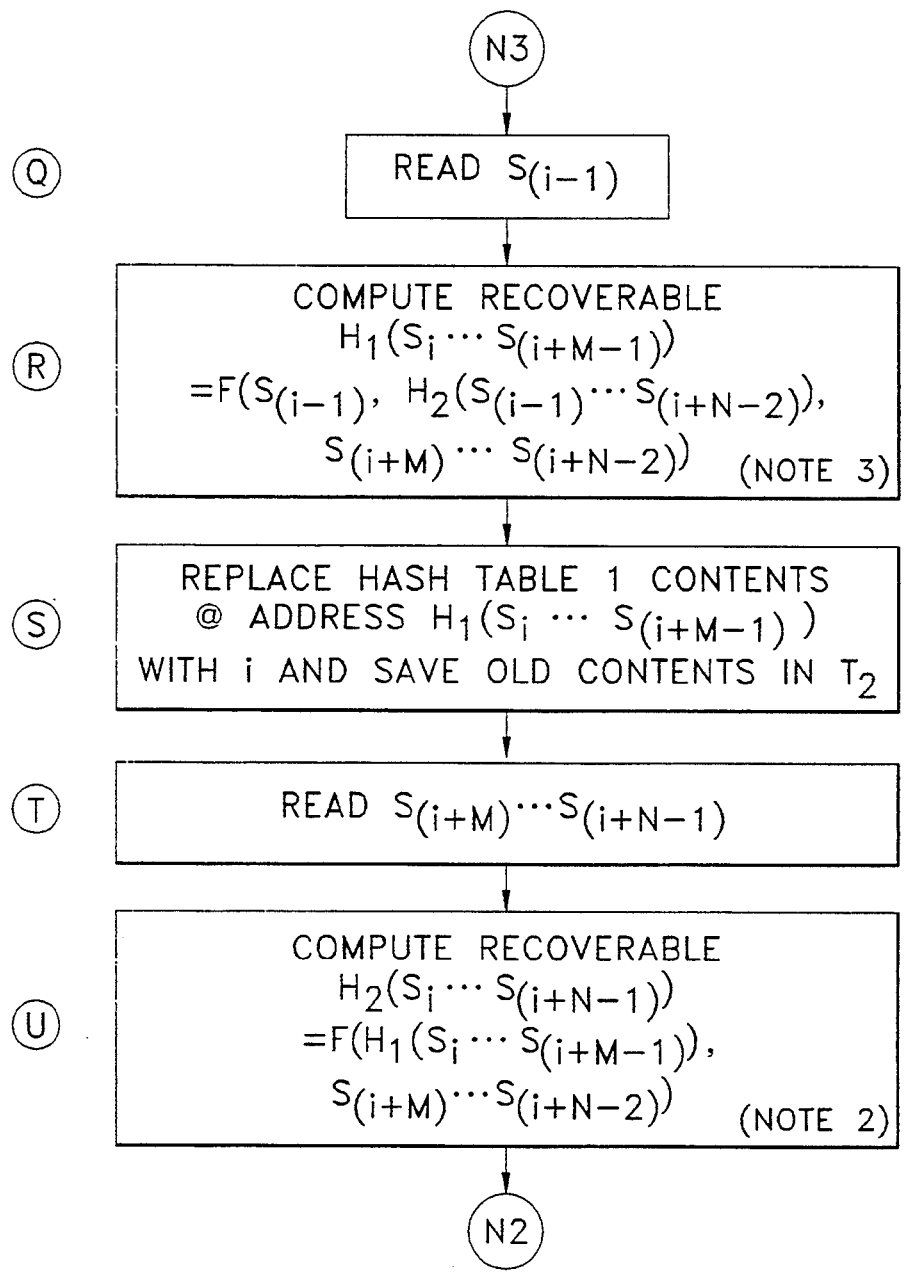

FIG. 1 presents the general flow diagram for compressing data. The system includes the following characteristics: (1) two hash tables, 1 and 2 using respectively a different input data subblock size; the one hash table having a larger subblock size and the second hash table being for a smaller subblock size; (2) each hash table entry contains only a source pointer to previous input data;, (3) unconditional replacement of hash table entries is employed as a means of dealing with hash collisions and minimizing required hash table memory; (4) a recoverable hashing function when hash misses occur is employed to minimize processing time, and by this process, at least part of the hash key of one of the hash tables is determined from the hash key of the second of the hash tables; and (5) priority is given to matches by the second hashing function utilizing a larger subblock size. Input characters of respective subblock sizes are hashed to provide hash keys. Encoding of the data in the output stream is effected by any appropriate method.

In the flow diagram of FIG. 1, the various symbols are defined as follows:

Hash tables contain only source pointer (i)

$0 \leq i \leq 8195$ $S_o \ldots S_k$ = input data block $K \approx 8195$
i = source index, or source pointer (i)

$0 \leq i \leq 8195$

M = hash table 1 subblock size
Let j = DES pointer = DES index
N = Hash Table 2 subblock size
$T_1, T_2, T_3$ = Temp Store, H = result of hash computation Referring to (A) in the flow diagram, various initialization steps are performed before an input data block can be processed. A pointer to the current input data character, hereinafter called SRC pointer (i) is initialized to point to the beginning of the input data block ($S_o \ldots S_k$). A pointer to the data area to contain the compressed,or processed input data, (j) hereinafter called DES pointer is also initialized. Additionally, the hash tables ($H_M$, $H_N$) are initialized with a reference SRC pointer value to minimize the probability of falsely declaring a string match when a particular hash has yet to be used during the processing of a single input block. Typically, the reference value is set equal to the beginning SRC pointer, and later, when the backwards distance is computed, a check is made to make sure the backwards distance is greater than zero. Various methods exist to one skilled in the art to properly account for and reject false matches. Node 1 (N1) is the top of the repetitive portion of the processing loop, where a check for all of the input data being processed is performed.

Referring to (B), a temporary store ($T_1$) is loaded with the current contents of the SRC pointer. Later, when a string match is detected after several increments of the SRC pointer, the amount of incompressible data can be computed. Then a check is made to see if the amount of incompressible data has reached the limit of the encoder. In this embodiment, the encoder uses a count value for incompressible data, though other techniques would be equally suitable. If the incompressible data count has reached the limit of the encoder, then the incompressible data is encoded, the DES pointer is updated by the number of bytes used in the encoding process, and temp store ($T_1$) is again loaded with the SRC pointer to prepare for the next section of incompressible data.

Referring to (C), input data for the smaller subblock for hash table 1 are read in preparation for the recoverable hash computation to be performed in (D). In general, recoverable hash computations have the characteristic of each byte of the input subblock going through the same mathematical operations. These operations are capable of being reversed. The effect of the first byte of the input subblock on the final hash key can be removed from the final hash key by performing yet another set of reversal mathematical calculations using the final hash key and the first byte of the input subblock. This yields a hash key for the remaining bytes of said input subblock.

Consider the string "ABCDEABCD", with a subblock size for hash table 1 of 3, and a subblock size for hash table 2 of 4. To start, hash table 1 hashes the string "ABC" to produce a key $K_{11}$, and hash table 2 hashes the string "ABCD" to produce a key $K_{21}$. Since this is the first hash computation, a hash match is not found in either hash table, and the input source pointer is incremented to point at "BCD" and "BCDE" respectively. Note that key $K_{21}$ is based on the string "ABCD", while the key about to be computed, $K_{12}$, is based on the string "BCD". Rather than computing $K_{12}$ directly from the string "BCD", a shorter, faster computation is made using the character "A" and $K_{21}$. The computation removes the effect of the character "A" on $K_{21}$, yielding $K_{12}$. Utilization of this special recovery hash computation allows for much quicker hash computations when hash misses occur, as will be demonstrated in the discussion below. Note 1 provides an example and more details of the recovery hash calculation in step (D).

In step (E), the hash key computed in step (D) is used as an address into hash table 1. The old contents at that address are then unconditionally replaced with the SRC pointer contents at the hash key $H_1$, and the old contents are placed in temp store $T_2$ for later string comparisons.

In step (F), the number of additional bytes necessary over step (C) to constitute the larger subblock size are read in preparation for the second recoverable hash value $H_2$ computed in step (G). The hash table 2, hash key $H_2$ in (G) is computed using the hash key $H_1$ computation obtained in (D), and the additional input data bytes read in (F). The characteristics and goals of these computations are identical to those in step (D). Note 2 provides an example and more details of the recovery hash calculation in step (G).

Step (H) performs for hash table 2 the same function as step (E) does for hash table 1. After completion of step (H), both hash tables have been updated with the SRC pointer at their respective hash keys $H_1$, and $H_2$, and two temp stores T, and $T_2$ with previous string match candidate pointers have been prepared. Giving preference to the longer subblock matches, step (I) compares the string pointed to by temp store $T_3$, namely the prior contents of $H_2$ with the string pointed to by the SRC pointer.

If the match length at $T_3$ is greater than or equal to the length of the smaller subblock M, step (J) is performed. Otherwise step (N) is performed.

Step (N) is the counterpart of step (I) for the first hash table 1 containing keys $H_1$ based on the smaller subblock size hash computation. If no match for the larger subblock string pointer in temp store $T_3$ is obtained, then the same test is made for the string pointed to by temp store $T_2$ and the string pointed to by the SRC pointer. If the match length in step (N) is greater than or equal to the length of the smaller subblock M, processing continues at step (J). Otherwise, processing continues at step (O).

In step (J), the backwards distance of the matching string from the SRC pointer is computed and tested for being valid, i.e., greater than zero, and less than the maximum backwards distance that the encoder can represent. In most embodiments, the backwards distance limit of bytes of data would be 4096 to 8192, depending on the number of bits used in the encoder for backwards distance.

If the backwards distance computed in step (J) is within limits, then in step (K) incompressible data is encoded and the DES pointer (j) is updated.

Processing continues in step (L), and compression occurs with the encoding of the backwards distance and match count. Depending on the incompressible data count in step (K), it could be feasible to utilize a special compression token in step (L). This token could also contain an incompressible data count as well as a match count and backwards distance, and would allow the combining of steps (K) and (L) into one "hybrid" token containing both incompressible and compressible data.

In step (M), the SRC pointer is then adjusted by the match count so that the next input data subblock to be considered will be that just beyond the matching string, and processing continues at the top of the loop at node N1.

If the backwards distance in step (J) is not within limits, or if no matches longer than minimum match length were found in steps (I) or (N), then processing continues at step (0). The SRC pointer (i) is incremented by one to prepare for another multiple recoverable hash computation series. Step (P) is a repeat of the functionality in step (B). A check is made for the incompressible data count being at the limit of the encoder, and encoding of the incompressible data if necessary.

Processing continues at step (Q), where the first byte of the previous subblock is read in preparation for the recovery hash computation performed in step (R).

The conditions present at step (R) permit the hash key $H_1$ computation for the smaller subblock based hash table 1 to be performed in a reduced number of clocks. The previous hash key $H_2$ computation for hash table 2 obtained in step (U) or step (G) with input data is used, rather than computing directly from the input data. Thus, for the recoverable hashing computation:

$$H_{1(i)} = F(H_{2(i-1)}, S_{(i-1)})$$
$$= F(S_{(i)} \ldots S_{(i+N-1)})$$

Any computation series which obeys the above rules can be used. Note 3 provides an example and more details of the recovery hash calculation in step (R).

Steps (S), (T) and (U) for the smaller hash key $H_1$, are identical to steps (E), (F) and (G), in which the larger subblock hash key $H_2$ is computed.

Processing then continues at step (H) in the manner and sequence described above.

Example of Compression

For the preferred embodiment, M=3, N=4, hash table 1 size=2048 bytes, hash table 2 size=4096 bytes.

Note 1: For the preferred embodiment, the recoverable hash table 1, hash key value $H_1=f(S_{(i)} \ldots S_{(i+M-1)})$ is computed in step (D) using the following steps:
1. Shift left first byte (multiply by 2)
2. Exclusive OR second byte with result of 1
3. Shift left result of 2 (multiply by 2)
4. Exclusive OR third byte with result of 3
5. Shift left result of 4 (multiply by 2)

Note 2: For the preferred embodiment the recoverable hash table 2, hash key value $H_2=f(S_{(i)} \ldots S_{(i+N-1)})$ is computed in steps (G) and (U) using the following steps:

6. Exclusive OR fourth byte with result of Note 1, step 5
7. Shift left result of 6 (multiply by 2)

Note 3: For the preferred embodiment, the recoverable hash table 1, hash key value $H_3 = F(H_2, S_{i-1})$ is computed in step (R) using the following steps:

8. Shift left the byte at SRC pointer minus 1 four times (multiply by 16, because the first byte is represented in the four byte hash multiplied by 16)
9. Exclusive OR previous four byte hash with result of 8

Since operations 8–9 yield the same result as operations 1–5 when hash misses occur, a substantial data rate improvement can be obtained through reduced steps. This eliminates the steps of reading the input data and performing many computations over again, and hence improves the rate of data compression.

Decompression

Figure 2:
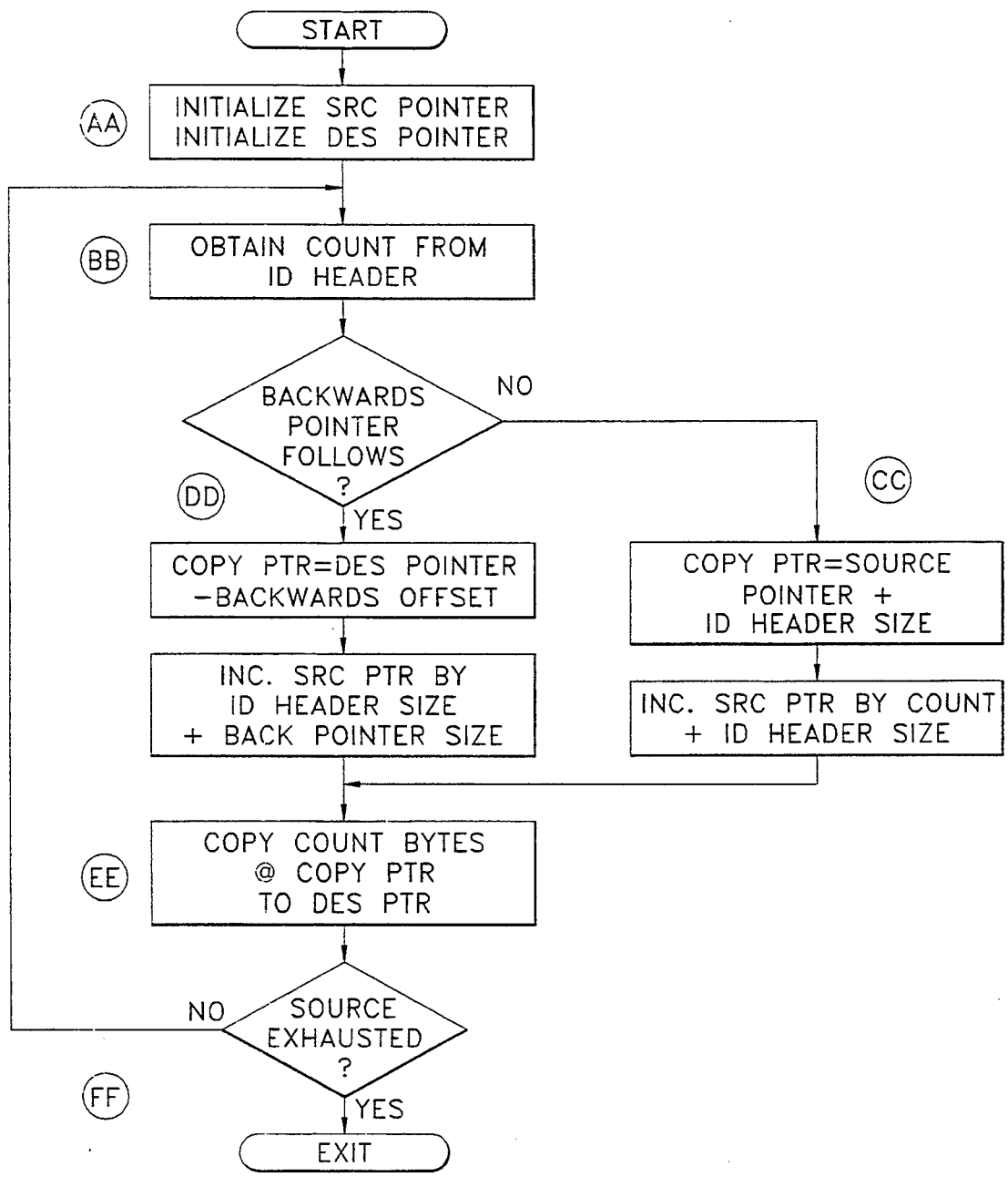
FIG. 2 is a flow diagram of a decompression method of the present invention.

When the information is decompressed back to its original form, the general form of the decompression as illustrated in FIG. 2 is utilized. An identification header (ID) in the data "output" stream which is to be decompressed may contain a single bit to distinguish between incompressible and compressible data. Alternatively, there may be multiple bits to distinguish between incompressible data tokens and many different compressible data tokens containing backwards pointers and match counts of varying length.

The flow chart for the decompression method is illustrated in FIG. 2. In step (AA), both the SRC pointer which points to the compressed data, and DES pointer, which points to the decompressed data, are initialized. Next, in step (BB), the count value is obtained from the ID header as well as the indicator as to whether this ID header is for a compressed token or if incompressible data follows. If incompressible data follows, step (CC) is performed. A copy pointer is set to be equal to the SRC pointer plus the ID header size, then the SRC pointer is incremented by the match count value plus the ID header size. If a compressed token follows, then step (DD) is performed instead. The copy pointer is set to the DES pointer minus the backwards distance in the token, and the SRC pointer is incremented by the ID header size plus the compressed token size.

In both the incompressible data and compressible token cases, the count number of bytes obtained in step (BB) are copied from the copy pointer to the DES pointer in step (EE). In step (FF), the SRC pointer is examined to see if all of the source data has been processed. If not, processing resumes again at step (BB).

Encoding

Figure 3:
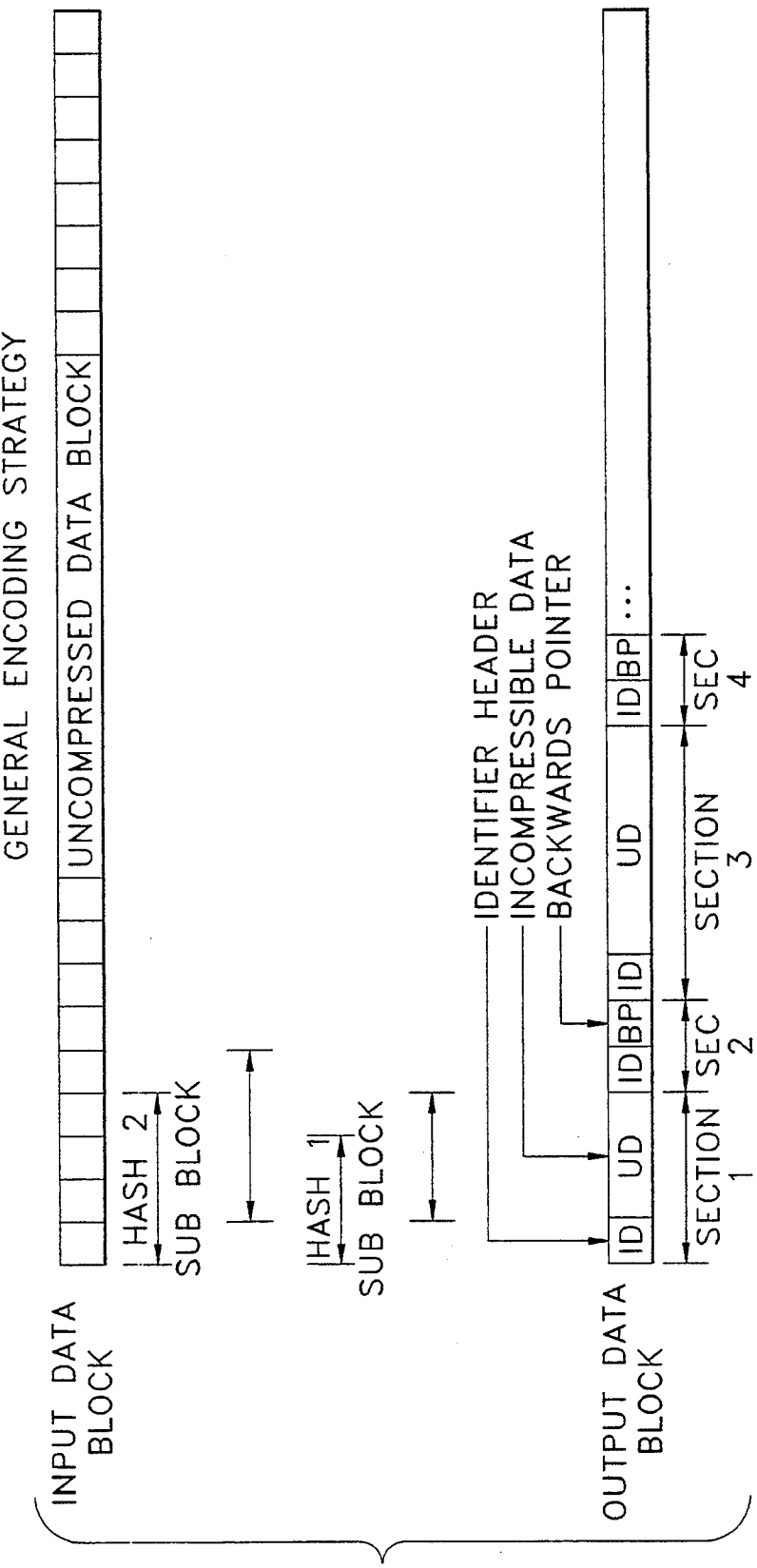
FIG. 3 is a block diagram of the general encoding strategy of the present invention.

FIG. 3 diagrams a general encoding format of the compressed output data. The compressed output data consists of variable length sections. An input data block of uncompressed data is shown in relation to an output data block having compressed data and uncompressed data.

The hashing subblock size for hash table 1, namely 3, and the subblock size for hash table 2, namely 4, are shown in FIG. 3.

Each section could be one of the following:
(1) an identification header signifying incompressible data, followed by incompressible data (incompressible token) Sections 1 and 3 of FIG. 3; or
(2) an identification header signifying compressed data, followed by a match count and backwards pointer (compressed token) Sections 2 and 4 of FIG. 3, or
(3) an identification header signifying both incompressible data and compressed data, followed by a match count, backwards pointer, and incompressible data. For reconstruction purposes, the incompressible data could appear before or after the compressed data, hybrid token.

Sections of type (1) tend to be used for incompressible data counts that grow very large, such that the worst case growth of the section is very small. Sections of type (2) tend to be used for compressed tokens that have very large match count values, or very large backwards distances, or both. Such sections need a large number of bits.

Sections of type (3) tend to be used when both the incompressible count and the match count and the backwards distance require a smaller number of bits. In this manner, usage of sections of type (3) will result in less bits being used in the compressed output data because of eliminating unnecessary ID headers which typically take 8 bits.

Example of Compression and Encoding

Figure 4:
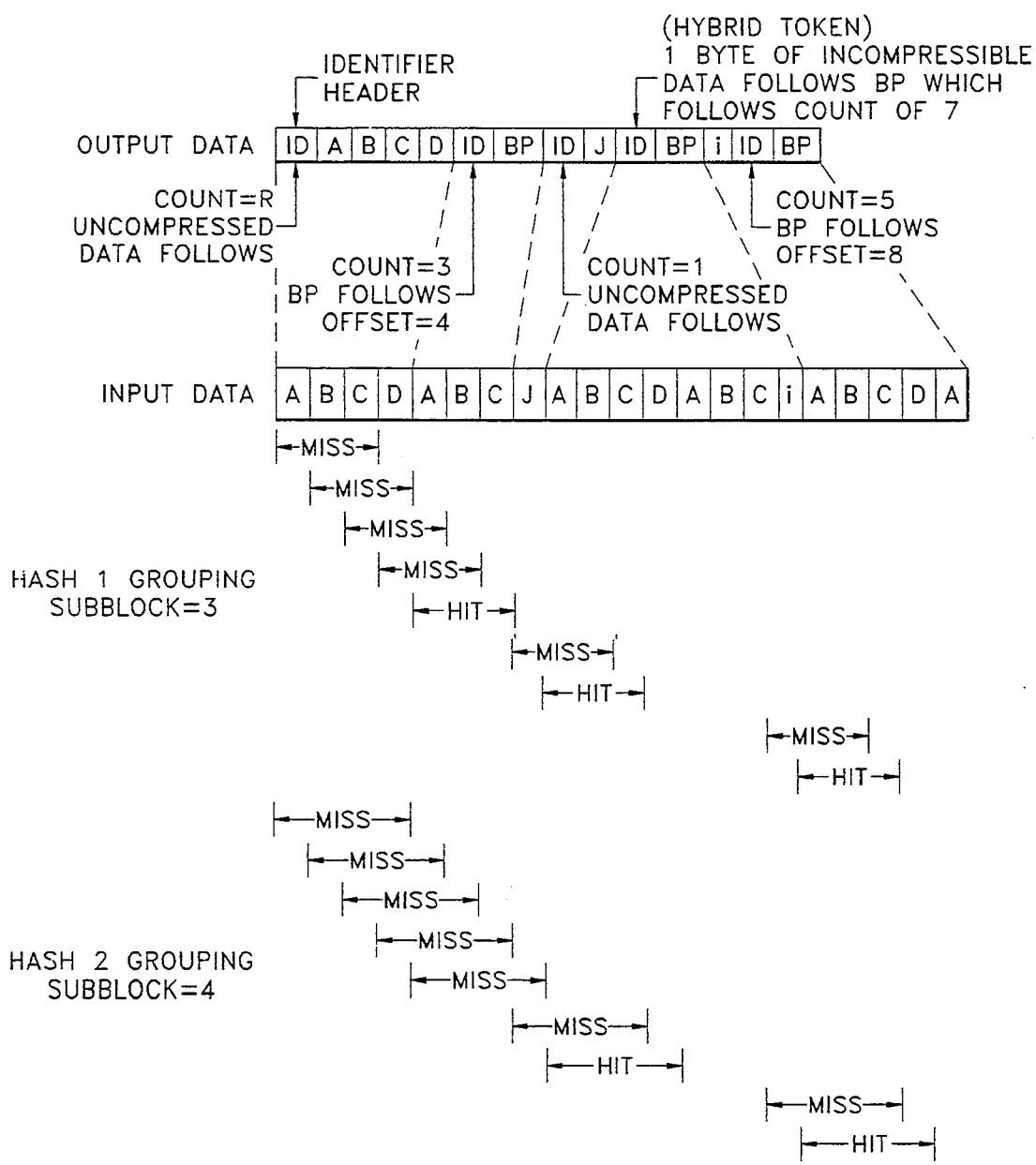
FIG. 4 is a block diagram of a search function for ASCII text.

An encoding example is demonstrated in FIG. 4 of the ASCII string "ABCDABCJABCDABCIABCDA" using the preferred embodiment of the present invention with section types (1) and (2), and (3) discussed above with regard to FIG. 3.

Two hash tables are used, with hash table 1 working with a subblock size of three bytes, and hash table 2 working with a subblock size of four bytes. Hash table 2 is given preference in matching, i.e., if matches on larger subblocks occurs, any hash hit on the smaller subblock hash table is ignored. Both hash tables use unconditional replacement to deal with hash collisions.

In the beginning, the strings "ABC", "ABCD", "BCD", "BCDA", "CDA", "CDAB", "DAB", and "DABC" are not referenced in either hash table, so the SRC pointer is incremented by one until it reaches a value equal to the starting SRC pointer plus four. At this point, hash table 1 obtains a hit, because the string "ABC" at offset four, matches the string "ABC" at offset zero. The output, after encoding this hit, consists of an ID header denoting incompressible data, followed by the four bytes of incompressible data. This is followed by an ID header indicating compressed data with a count of 3, followed by a backwards pointer of one byte to represent an offset of 4.

Next, the SRC pointer is incremented by the match count, so that the SRC pointer points to the string "JAB" at offset 7. Both hashes miss on the string "JAB" and "JABC", so the SRC pointer is incremented by one to try the strings "ABC" and "ABCD". Both the 3 byte subblock hash and the 4 byte subblock hash tables now have a "hit", but the 4 byte subblock hash is given preference. The string at offset 8 is compared to the string at offset 0, and the matching string "ABCDABC" of length 7 is found. The output compressed stream is then updated with an incompressible count of one, followed by the incompressible "J", followed by a compressible count of 7, followed by a backwards distance of 8, using the "hybrid" token.

The SRC pointer is then incremented by 7, and the process continues. At offset 16, a similar "double hit" occurs. The hash match from hash table 2 is given preference, such that a match length of 5 is encoded.

FIG. 4 demonstrates the advantage of multiple hashing over a single hashing method. At offsets 8 and 6, the dual hashing method "hits" on string matches of 7 and 5 bytes respectively, while a single 3 byte hashing method would have only matched on 3 bytes and 3 bytes respectively. Although a single 4 byte subblock hash would have found the matches at offsets 8 and 16, it would have missed the 3 byte match at offset 4. The benefit of multiple hashing is that the compression method can be biased towards locating long string matches without sacrificing short string matches.

Apparatus and System for Compression

Figure 5:
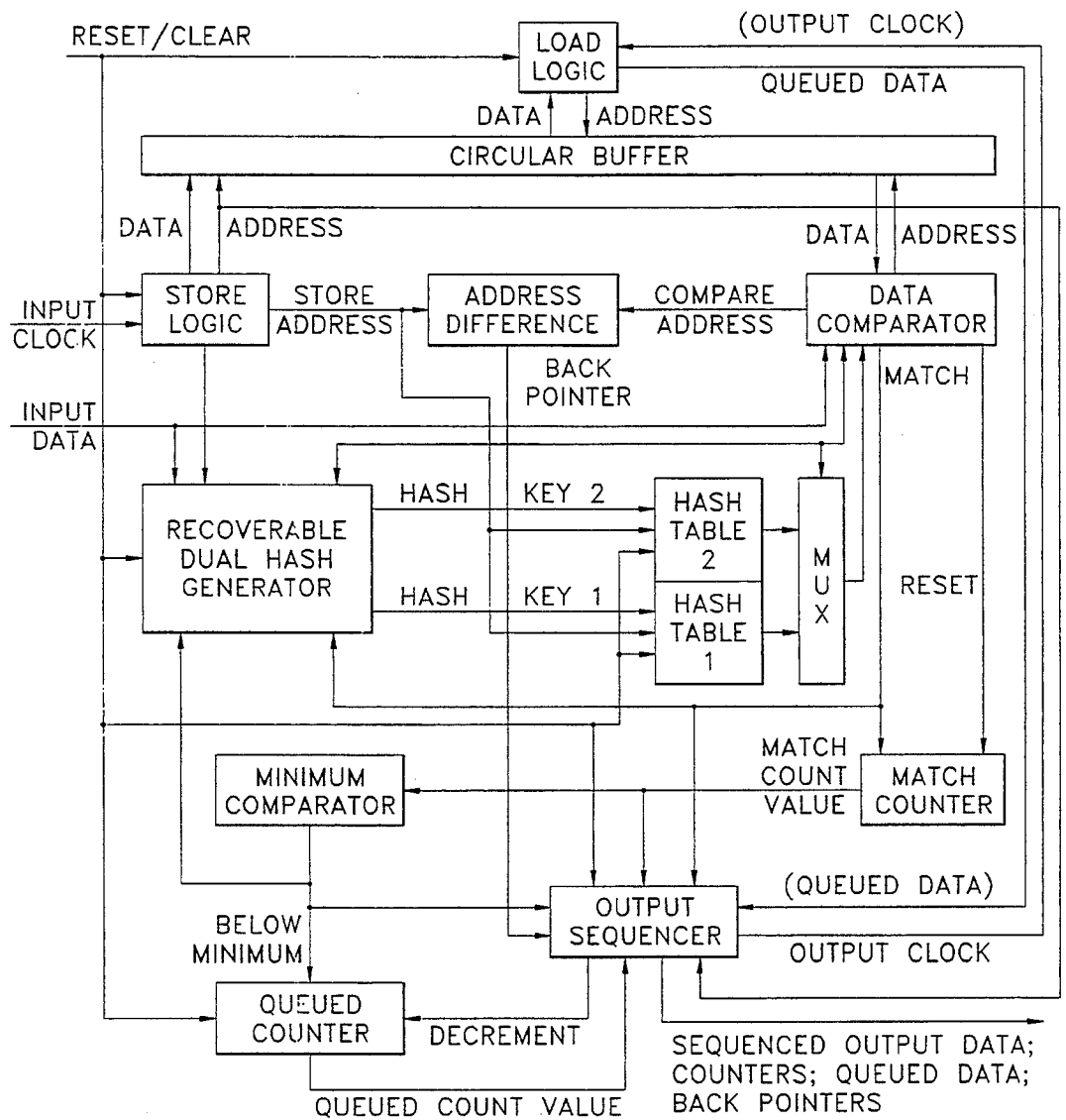
FIG. 5 is a block diagram of compression apparatus used to perform the present invention.

An example of apparatus used in the preferred compression method is illustrated in FIG. 5.

A store logic is responsible for moving input data into a circular buffer for subsequent reference. After each store, the internal address is incremented.

A recoverable dual hash generator acts as the temp store and remembers the last several bytes and prior hash table 2, hash key, depending on the selected subblock sizes for the hash tables. After a reset/clear signal has been applied, as each input data byte is received, two new hash key values are generated from the recoverable dual hash generator. Each of the two hash tables in memory retrieves the respective key value associated with a respective hash key. The prior address is unconditionally replaced with a new input data address from the store logic.

A data comparator resets a match counter, then computes a match count by sequentially comparing bytes in the circular buffer with input bytes. During this process, the data comparator latches the address value from hash table 2 only if the result of the previous byte compare was not equal; otherwise, it increments the previous address value from hash table 2 and increments the match counter.

This data comparison process repeats for the beginning hash key from hash table 2 until the non-match condition occurs. Then, the match count value is evaluated by a minimum count comparator to determine if the match count is above the minimum value, which is typically three bytes.

If the minimum comparator below signal is true, a hash table mux control line is switched so that the hash key from hash table 1 can be evaluated in a similar manner, and the match counter is reset. An output sequencer waits until either the queued counter for incompressible bytes reaches its maximum value, or until the minimum comparator shows a match count value from either hash table 1 or hash table 2 that is equal to or greater than the minimum value and a backwards distance greater than zero.

If the minimum comparator below signal is false, the output sequencer will prepare for a match encoding by first outputting any queued incompressible data held in the circular buffer through the load logic, followed by an encoding of the backwards pointer and the match count.

Recoverable Dual Hash Generator

Figure 6:
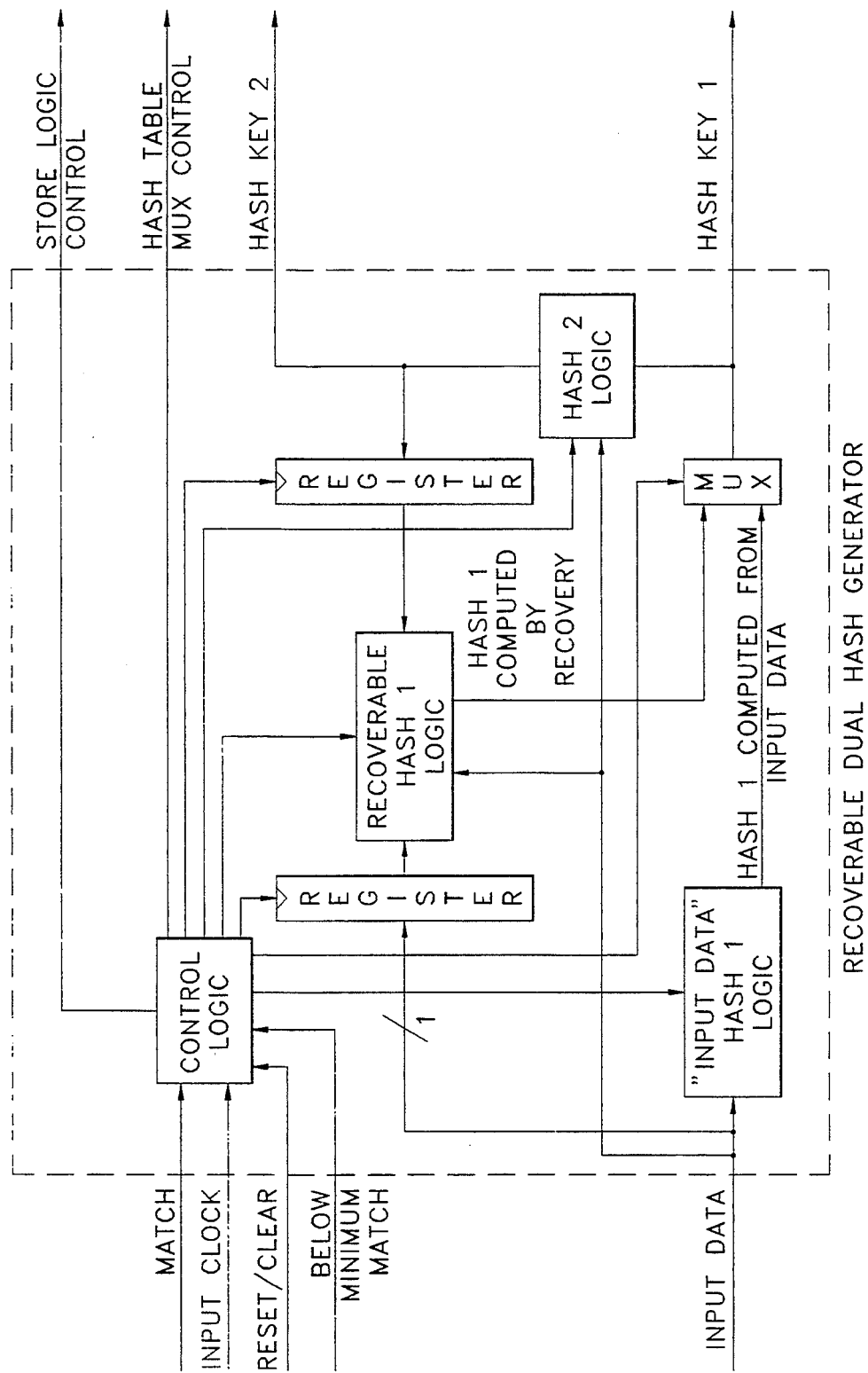
FIG. 6 is a block diagram of recoverable hashing apparatus used in FIG. 5.

A detailed block diagram of the recoverable dual hash generator is illustrated in FIG. 6. The recoverable dual hash generator interfaces with the following major components of the compression apparatus of FIG. 5: store logic, hash table 1, hash table 2, data comparator, minimum comparator, and other timing and control signals.

After a reset/clear signal has been applied, the hash table mux control is set to select hash table 2, and the beginning accumulators from recoverable hash 1 logic, "input data" hash 1 logic, and hash 2 logic are cleared. The control logic then clocks in input data bytes to provide enough data to compute "input data" hash 1 and hash 2, and places hash key value 1 and hash key value 2 on the output lines to the hash tables. The control logic then waits for the match signal to go false, indicating that the match length for hash 2 has been determined. If the "below minimum match" signal is true, the control logic changes the state of the hash table mux control, so the data comparator can perform a match length comparison for hash table 1. This action will also cause the data comparator to set the match signal to true, pending a byte-for-byte comparison of the string at the store address and the string in the circular buffer pointed to by the hash table 1 contents at the hash table 1 hash key.

When the match signal goes false for the second time, the "below minimum match" signal is once again tested. If the "below minimum match signal" is true, the hash index 1 mux control line is changed so that the hash index 1 is delivered from the recoverable hash 1 logic, the store logic control increments the store address, and the hash table mux control is switched back to hash table 2. The comparison process described in the prior paragraph is then repeated. The hash key 1 will be delivered from the recoverable hash 1 logic for so long as no match from hash table 1 or hash table 2 occurs which causes the "below minimum match" signal to become false.

If the "below minimum match" signal is false, the control logic prepares as though it was starting over at the beginning of the input data block in anticipation of the output sequencer outputting incompressible data, followed by the backwards distance and match count.

Example of Compression System

The following is an example utilizing the above compression apparatus.

Before starting, the apparatus is reset with the "reset/clear" signal; this resets the output sequencer, clears the store logic and a load logic internal address counters, the dual recoverable hash generator internal registers, and marks the hash table entries with the beginning input address. The unused hash table entries will, in the worst case, match on address location zero. In this special case, the output sequencer will throw out matches that occur with backwards distances of zero or less, so no false matches will be declared by the compression apparatus.

Assume that the input string is "ABCABCABCAB-CABCDEF". As the first six characters "ABCABC" are received, the characters are stored in the circular buffer, the queued counter is incremented, and hash computations are performed on the strings "ABC", "ABCA", "BCA", "BCAB", "CAB", and "CABC". When the second "ABC" at offset 3 is read, the data comparator reports a match from hash table 2 until a match count of length 12 is reached. The output sequencer latches the back pointer value from the address difference logic, subtracts the match count value from the queued counter value of 15, and then transfers 3 bytes of incompressible data from the circular buffer to the output destination, followed by the latched backwards distance and match count.

As incompressible data is transferred from the circular buffer, the queued counter is decremented. Subsequently, the string "DEF" does not match any previous string, and is output as incompressible data with a count of 3 in a similar manner to the first occurrence of "ABC".

Apparatus and System for Decompression Apparatus

Figure 7:
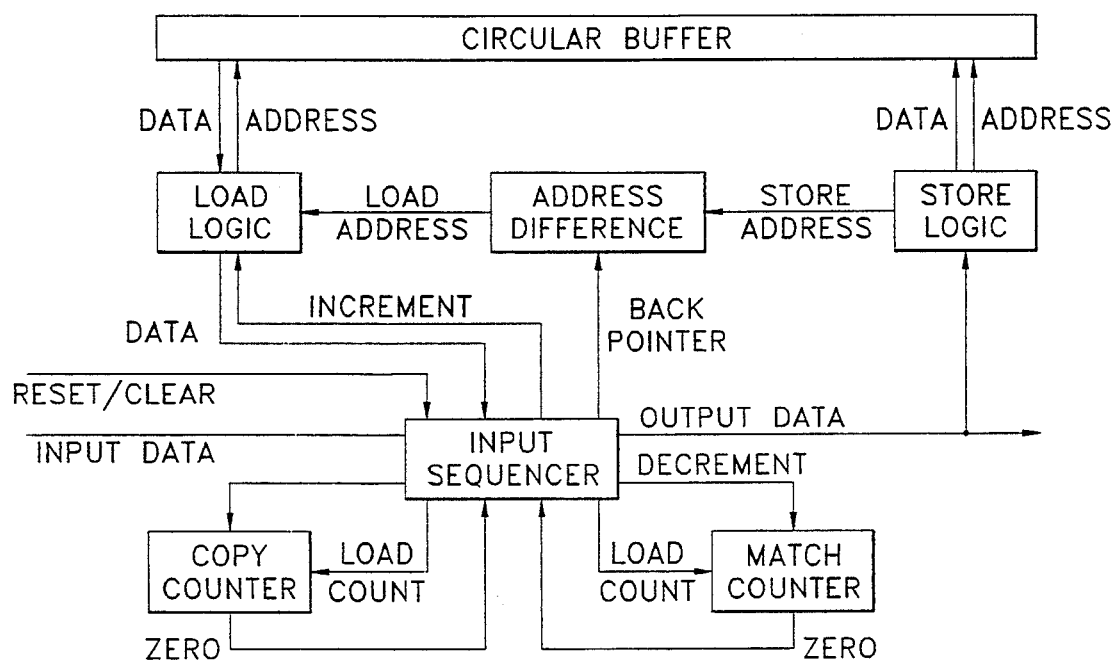
FIG. 7 is a block diagram of decompression apparatus used to perform the present invention.

A decompression apparatus is illustrated in FIG. 7. The store logic stores all output data into the circular buffer for subsequent reference. After each store, the internal address is incremented- The input sequencer decodes the input data stream. If a copy count is decoded, it is loaded into the copy counter and then decremented as subsequent input data and passed through as output data. If a match count is decoded, it is loaded into the copy counter and the associated back pointer is loaded into the address difference logic. The copy counter is decremented as data from the circular buffer is obtained by the load logic and passed through as output data.

Example of Decompression System

An example utilizing the decompression system is now described.

Before starting, the apparatus is reset with reset/clear signal; this resets the input sequencer (note that it is not necessary to clear the store logic and load logic internal address counters).

Assume that the input string is "{id3}ABC{id2}{bp3-}{id3}DEF" in this example (the result of compressing the string "ABCABCABCABCABCDEF" from the previous example). When the first {id3} is decoded, the input sequencer loads the counter value of 3 into the copy counter and copies the string "ABC" into the circular buffer as well as sending it as output data. When the {id2}{bp3} is decoded, the input sequencer loads the count value of 12 into the match counter, loads the back pointer value of 3 into the address difference logic (generating the correct load address value), and retrieves the 12 characters "ABCABCABCABC" from the circular buffer, which are copied back into the circular buffer (this creates the last 9 characters of this string in this example), as well as sending them as output data. When the second {id3} is decoded, the input sequencer again loads the count value of 3 into the copy counter and copies the string "DEF" into the circular buffer as well as sending it as output data.

General

Although a specific embodiment of the invention has been described with reference to the drawings, it should be understood that such embodiments are by way of example only and merely illustrative of but a small number of the many possible specific embodiments which can represent applications of the principles of the invention.

Various changes and modifications are possible within the spirit, scope, and contemplation of the invention. For instance, although the embodiments have been described with regard to two hash tables, it is possible that multiple, for instance 3, 4 or more hash tables can be used. Moreso, subblock sizes can be different from 3 and 4 respectively. Any appropriate size or combination can be used; for instance 4 and 5; 2 and 4; 3 and 5. Moreso, many different encoding techniques can be applied to code the data in the output stream.

It would still be considered within the scope of the invention, for example, if the system were implemented with any one or more of the following characteristics: (1) multiple hash tables using different input block sizes, where each hash table entry contains source pointers and match counts; (2) hash tables which include a linking pointer linked list to other hash table entries and hash tables arranged with fixed assignments in rows or columns; (3) conditional replacement of hash table entries is employed to deal with hash collisions; (4) recoverable hashing is not employed; and (5) the longest match of the multiple hashing operations is selected for encoding. Other means can be provided for determining whether to select a hash match on a longer or shorter subblock size thereby to obtain the desired compression rate and/or compression ratio for the input data.

Any appropriate encoding format or protocol can be used to output the compressed data. Examples include:
1. Backwards pointer and match counts of fixed length (fixed length tokens);
2. Backwards pointers and match count of variable length (variable length tokens);
3. Incompressible data tokens utilizing a flag bit;
4. Incompressible data tokens utilizing a count field;
5. Non-byte aligned tokens;
6. Byte-aligned tokens; and
7. Encoding systems which pack flag bits to denote uncompressible/compressible data into groups of modulo 8 to maintain byte alignment.

The system of compressing and decompressing data in terms of the invention has multiple applications. These include the storage of data for instance, for later computing and the transmitting and transferring of data over communication channels, such as television or radio and the like.

The scope of the invention is to be determined in terms of the appended claims.

We claim:

1. A method of compressing a stream of input data into a compressed stream of output data comprising:
   (a) maintaining multiple hash tables, each respectively for a different data subblock size, and each hash table having entries having respective hash keys,
   (b) hashing a string of input characters of the input data for each of the different data subblock sizes to obtain the hash keys, and using these hash keys to address hash table entries containing hash information to facilitate location of string matches,
   (c) hashing, for each of the subblock sizes, subsequent strings of data and searching for a match of prior strings related to the information addressed by hash keys in at least one of the hashing tables, and
   (d) if a hash match occurs in at least one hash table, outputting the subsequent occurrence of the string as compressed data, and if a hash match for each of the subblocks does not occur in any hash table, outputting at least the first character of an input subblock as uncompressed data.

2. A method as claimed in claim 1 wherein the hashed information in relation to the input data is stored in at least one of the hash tables and is selectively only a source pointer to prior hashed subblocks or the source pointer representative of the hashed subblocks and additional data.

3. A method as claimed in claim 1 wherein selectively either one or multiple of the hash table entries contain selectively only a source pointer to prior hashed subblocks, or a source pointer to prior hashed subblocks and additional data.

4. A method as claimed in claim 1 wherein the hashed information in the hash entries in at least one of the hash tables is selectively unconditionally replaced, or conditionally replaced or removed on the occurrence of subsequent hashed information being directed by a hash key to the hash table entry containing information representative of prior hashed subblocks.

5. A method as claimed in claim 1 wherein hashing is effected on a data subblock size of three for a first hash table and a data subblock size of four for a second hash table.

6. A method of compressing a stream of input data into a compressed stream of output data comprising:
 (a) maintaining multiple hash tables, each respectively for a different data subblock size, and each hash table having entries having respective hash keys,
 (b) hashing a string of input characters of the input data for each of the different data subblock sizes to obtain the hash keys, and using these hash keys to address hash table entries containing hash information to facilitate location of string matches,
 (c) hashing, for each of the subblock sizes, subsequent strings of data and searching for a match of prior strings related to the information addressed by hash keys in at least one of the hashing tables,
 (d) if a hash match occurs in at least one hash table, outputting the subsequent occurrence of the string as compressed data, and if a hash match for each of the subblocks does not occur in any hash table, outputting at least the first character of an input subblock as uncompressed data, and
 (e) determining at least part of a hash key for one of the hash tables from the hash key of another of the hash tables.

7. A method as claimed in claim 6 wherein the hashed keys for a first hash table are determined on a first data subblock size and wherein a second hash table contains keys obtained from the second subblock size, and wherein the hash keys for the first subblock size are obtained at least in part from the second hash table keys.

8. A method as claimed in claim 6 wherein the hashed information in relation to the input data is stored in at least one of the hash tables and is selectively only a source pointer to prior hashed subblocks or the source pointer representative of the hashed subblocks and additional data.

9. A method as claimed in claim 6 wherein selectively either one or multiple of the hash table entries contain selectively only a source pointer to prior hashed subblocks, or a source pointer to prior hashed subblocks and additional data.

10. A method as claimed in claim 6 wherein the hashed information in the hash entries in at least one of the hash tables is selectively unconditionally replaced, or conditionally replaced or removed on the occurrence of subsequent hashed information being directed by a hash key to the hash table entry containing information representative of prior hashed subblocks.

11. A method as claimed in claim 6 wherein hashing is effected on a data subblock size of three for a first hash table and a data subblock size of four for a second hash table.

12. A method of compressing a stream of input data into a compressed string of output data comprising:
 (a) maintaining multiple hash tables, each respectively for a different data subblock size, and each hash table having entries having respective hash keys,
 (b) hashing a string of input characters of the input data for each of the different data subblock sizes to obtain the hash keys, and using these hash keys to address hash table entries containing hash information to facilitate location of string matches,
 (c) hashing, for each of the subblock sizes, subsequent strings of data and searching for a match of prior strings related to the information addressed by hash keys in at least one of the hashing tables,
 (d) if a hash match for each of the subblocks does not occur in any hash table, outputting at least the first character of an input subblock as uncompressed data, and
 (e) if a hash match occurs in at least one hash table, outputting the subsequent occurrence of the string as compressed data, such that when a hash match occurs in a table related to a larger subblock size and a hash match occurs in a table related to a smaller subblock size, the hash match in the hash table of the larger subblock size is selected for the compressed data output.

13. A method as claimed in claim 12 wherein the hashed information in relation to the input data is stored in at least one of the hash tables and is selectively only a source pointer to prior hashed subblocks or the source pointer representative of the hashed subblocks and additional data.

14. A method as claimed in claim 12 wherein selectively either one or multiple of the hash table entries contain selectively only a source pointer to prior hashed subblocks, or a source pointer to prior hashed subblocks and additional data.

15. A method as claimed in claim 12 wherein the hashed information in the hash entries in at least one of the hash tables is selectively unconditionally replaced, or conditionally replaced or removed on the occurrence of subsequent hashed information being directed by a hash key to the hash table entry containing information representative of prior hashed subblocks.

16. A method as claimed in claim 12 wherein hashing is effected on a data subblock size of three for a first hash table and a data subblock size of four for a second hash table.

17. A method of compressing a stream of input data into a compressed string of output data comprising:
 (a) maintaining multiple hash tables, each respectively for a different data subblock size, and each hash table having entries having respective hash keys,
 (b) hashing a string of input characters of the input data for each of the different data subblock sizes to obtain the hash keys, and using these hash keys to address hash table entries containing hash information to facilitate location of string matches,
 (c) hashing, for each of the subblock sizes, subsequent strings of data and searching for a match of prior strings related to the information addressed by hash keys in at least one of the hashing tables,
 (d) if a hash match for each of the subblocks does not occur in any hash table, outputting at least the first character of an input subblock as uncompressed data, and
 (e) if a hash match occurs in a hash table, outputting the subsequent occurrence of the string as compressed data, such that where a hash match occurs for more than one hash table, determining the longer match length of the string of input data for each respective hash table, and outputting the longer match length as the compressed data output.

18. A method of compressing a stream of input data into a compressed string of output data comprising:
(a) maintaining multiple hash tables, each respectively for a different data subblock size, and each hash table having entries having respective hash keys,
(b) hashing a string of input characters of the input data for each of the different data subblock sizes to obtain the hash keys, and using these hash keys to address hash table entries containing hash information to facilitate location of string matches,
(c) hashing, for each of the subblock sizes, subsequent strings of data and searching for a match of prior strings related to the information addressed by hash keys in at least one of the hashing tables,
(d) if a hash match for each of the subblocks does not occur in any hash table, outputting at least the first character of an input subblock as uncompressed data,
(e) if a hash match occurs in a hash table, outputting the subsequent occurrence of the string as compressed data, such that where a hash match occurs in a table related to a larger subblock size relative to a hash match in a table related to a smaller subblock size, the hash match of the larger subblock size is selected as the compressed data output, and
(f) wherein the hash keys for the larger subblock size are computed using at least part of the value of hash keys from the smaller subblock size.

19. A method of compressing a stream of input data into a compressed string of output data comprising:
(a) maintaining multiple hash tables, each respectively for a different data subblock size, and each hash table having entries having respective hash keys,
(b) hashing a string of input characters of the input data for each of the different data subblock sizes to obtain the hash keys, and using these hash keys to address hash table entries containing hash information to facilitate location of string matches,
(c) hashing, for each of the subblock sizes, subsequent strings of data and searching for a match of prior strings related to the information addressed by hash keys in at least one of the hashing tables,
(d) if a hash match for each of the subblocks does not occur in any hash table, outputting at least the first character of an input subblock as uncompressed data,
(e) wherein when a hash match occurs in a table related to a larger subblock size relative to a hash match in a table related to a smaller subblock size, selecting the hash match of the larger subblock size as the compressed data output, and
(f) if a hash match occurs in a hash table, outputting the subsequent occurrence of the string as compressed data, such that when a larger subblock size does not match on a minimum match length, selecting the smaller subblock size hash value if such smaller subblock value matches for its respective minimum length.

20. A method as claimed in claim 17 wherein the hashed information in relation to the input data is stored in at least one of the hash tables and is selectively only a source pointer to prior hashed subblocks or the source pointer representative of the hashed subblocks and additional data.

21. A method as claimed in claim 17 wherein selectively either one or multiple of the hash table entries contain selectively only a source pointer to prior hashed subblocks, or a source pointer to prior hashed subblocks and additional data.

22. A method as claimed in claim 17 wherein the hashed information in the hash entries in at least one of the hash tables is selectively unconditionally replaced, or conditionally replaced or removed on the occurrence of subsequent hashed information being directed by a hash key to the hash table entry containing information representative of prior hashed subblocks.

23. A method as claimed in claim 17 wherein hashing is effected on a data subblock size of three for a first hash table and a data subblock size of four for a second hash table.

24. A method as claimed in claim 18 wherein the hashed information in relation to the input data is stored in at least one of the hash tables and is selectively only a source pointer to prior hashed subblocks or the source pointer representative of the hashed subblocks and additional data.

25. A method as claimed in claim 18 wherein selectively either one or multiple of the hash table entries contain selectively only a source pointer to prior hashed subblocks, or a source pointer to prior hashed subblocks and additional data.

26. A method as claimed in claim 18 wherein the hashed information in the hash entries in at least one of the hash tables is selectively unconditionally replaced, or conditionally replaced or removed on the occurrence of subsequent hashed information being directed by a hash key to the hash table entry containing information representative of prior hashed subblocks.

27. A method as claimed in claim 18 wherein hashing is effected on a data subblock size of three for a first hash table and a data subblock size of four for a second hash table.

28. A method as claimed in claim 19 wherein the hashed information in relation to the input data is stored in at least one of the hash tables and is selectively only a source pointer to prior hashed subblocks or the source pointer representative of the hashed subblocks and additional data.

29. A method as claimed in claim 19 wherein selectively either one or multiple of the hash table entries contain selectively only a source pointer to prior hashed subblocks, or a source pointer to prior hashed subblocks and additional data.

30. A method as claimed in claim 19 wherein the hashed information in the hash entries in at least one of the hash tables is selectively unconditionally replaced, or conditionally replaced or removed on the occurrence of subsequent hashed information being directed by a hash key to the hash table entry containing information representative of prior hashed subblocks.

31. A method as claimed in claim 19 wherein hashing is effected on a data subblock size of three for a first hash table and a data subblock size of four for a second hash table.

32. A method of compressing a stream of input data into a compressed string of output data comprising:
(a) maintaining multiple hash tables, each respectively for a different data subblock size, and each hash table having entries having respective hash keys, (b) hashing a string of input characters of the input data for each of the different data subblock sizes to obtain the hash keys, and using these hash keys to address hash table entries containing hash information to facilitate location of string matches, (c) hashing, for each of the subblock sizes, subsequent strings of data and searching for a match of prior strings related to the information addressed by hash keys in at least one of the hashing tables, (d) if a hash match occurs in at least one hash table, compressing and outputting the subsequent occurrence of the string in accordance with the hash match, and if a hash miss occurs, outputting such data as uncompressed data, and (e) when a hash miss occurs in the hash tables, hashing is effected for at least one of the hash tables by employing a hash key from the hash miss whereby a reduced number of operations is required for hashing.

33. A method as claimed in claim 32 wherein a value of the hash key from the hashing for one hash table is transferred at least in part into a value of the hash key for the second hash table.

34. A method as claimed in claim 32 wherein a value of hash key from the hash miss is used for obtaining a value of the hashing key from the same hash table.

35. A method as claimed in claim 32 wherein the hashed information in relation to the input data is stored in at least one of the hash tables and is selectively only a source pointer to prior hashed subblocks or the source pointer representative of the hashed subblocks and additional data.

36. A method as claimed in claim 32 wherein selectively either one or multiple of the hash table entries contain selectively only a source pointer to prior hashed subblocks, or a source pointer to prior hashed subblocks and additional data.

37. A method as claimed in claim 32 wherein the hashed information in the hash entries in at least one of the hash tables is selectively unconditionally replaced, or conditionally replaced or removed on the occurrence of subsequent hashed information being directed by a hash key to the hash table entry containing information representative of prior hashed subblocks.

38. A method as claimed in claim 32 wherein hashing is effected on a data subblock size of three for a first hash table and a data subblock size of four for a second hash table.

39. A method as claimed in claim 33 wherein the hashed information in relation to the input data is stored in at east one of the hash tables and is selectively only a source pointer to prior hashed subblocks or the source pointer representative of the hashed subblocks and additional data.

40. A method as claimed in claim 33 wherein selectively either one or multiple of the hash table entries contain selectively only a source pointer to prior hashed subblocks, or a source pointer to prior hashed subblocks and additional data.

41. A method as claimed in claim 33 wherein the hashed information in the hash entries in at least one of the hash tables is selectively unconditionally replaced, or conditionally replaced or removed on the occurrence of subsequent hashed information being directed by a hash key to the hash table entry containing information representative of prior hashed subblocks.

42. A method as claimed in claim 33 wherein hashing is effected on a data subblock size of three for a first hash table and a data subblock size of four for a second hash table.

43. A method as claimed in claim 32 wherein when a hash miss occurs, the hash key of the hash miss is used in the subsequent hashing by the step of at least one computation being a simple shift, or a computation being an exclusive OR.

44. A method of compressing a stream of input data into a compressed string of output data comprising:

(a) maintaining multiple hash tables, each respectively for a different data subblock size, and each hash table having entries having respective hash keys, (b) hashing a string of input characters of the input data for each of the different data subblock sizes to obtain the hash keys, and using these hash keys to address hash table entries containing hash information to facilitate location of string matches, (c) hashing, for each of the subblock sizes, subsequent strings of data and searching for a match of prior strings related to the information addressed by hash keys in at least one of the hashing tables, (d) if a hash match for each of the subblocks does not occur in any hash table, outputting at least the first character of an input subblock as uncompressed data, and (e) if a hash match occurs outputting the subsequent occurrence of the string as compressed data, such that when a hash match occurs in a table related to a larger subblock size relative to a hash match in a table related to a smaller subblock size, selectively applying the hash match from either the larger subblock size, thereby to obtain a higher compression rate or applying the longest match of both the hash matches thereby to obtain a high compression ratio.

45. A method as claimed in claim 44 wherein the hashed information in relation to the input data is stored in at least one of the hash tables and is selectively only a source pointer to prior hashed subblocks or the source pointer representative of the hashed subblocks and additional data.

46. A method as claimed in claim 44 wherein selectively either one or multiple of the hash table entries contain selectively only a source pointer to prior hashed subblocks, or a source pointer to prior hashed subblocks and additional data.

47. A method as claimed in claim 44 wherein the hashed information in the hash entries in at least one of the hash tables is selectively unconditionally replaced, or conditionally replaced or removed on the occurrence of subsequent hashed information being directed by a hash key to the hash table entry containing information representative of prior hashed subblocks.

48. A method as claimed in claim 44 wherein hashing is effected on a data subblock size of three for a first hash table and a data subblock size of four for a second hash table.

49. A method of compressing a stream of input data into a compressed string of output data comprising:

(a) maintaining a hash table for a data subblock size, the hash table having hash keys, (b) hashing a string of input characters of the input data for the data subblock size and entering the hash information into hash table entries addressed by hash keys, (c) hashing, for the subblock size, subsequent strings of data and searching for a match of prior strings related to the hashed information addressed by the hash keys in the hash table, (d) if a hash match occurs, compressing and outputting the subsequent occurrence of the string as compressed data, and if a hash miss occurs, outputting at least the first character of the subblock as uncompressed data, and (e) when a hash miss occurs in the hash table, hashing is effected for a next key for the hash table by employing the key from the hash miss whereby a reduced number of operations is required for hashing.

50. A method as claimed in claim 49 including maintaining multiple hash tables, each for a different subblock size and applying the key from a hash miss of each respective table to the next key of a hash table.

51. Apparatus for compressing a stream of input data into a compressed stream of output data comprising:
(a) maintaining multiple hash tables, each respectively for a different data subblock size, and each hash table having entries having respective hash keys,
(b) means for hashing a string of input characters of the input data for each of the different data subblock sizes to obtain the hash keys, and means for using these hash keys to address hash table entries containing hash information to facilitate location of string matches,
(c) means for hashing, for each of the subblock sizes, subsequent strings of data and searching for a match of prior strings related to the information addressed by hash keys in at least one of the hashing tables, and
(d) if a hash match occurs in at least one hash table, means for outputting the subsequent occurrence of the string as compressed data, and if a hash match for each of the subblocks does not occur in any hash table, means for outputting at least the first character of an input subblock as uncompressed data.

52. Apparatus as claimed in claim 51 including means in the hash table for storing selectively only a source pointer to prior hashed subblocks or the source pointer representative of the prior hashed subblocks and additional information.

53. Apparatus as claimed in claim 51 including means whereby selectively one or multiple of the hash table entries contain selectively only a source pointer to prior hashed subblocks or a source pointer to prior hashed subblocks and additional data.

54. Apparatus as claimed in claim 51 including means whereby hashed information in the hash entries in the hash tables are selectively unconditionally replaced, or conditionally replaced or removed on the occurrence of subsequent hashed data being directed by a key to the hash table entry containing information representative of prior hashed subblocks.

55. Apparatus as claimed in claim 51 including means for effecting hashing on a data subblock size of three for a first hash table and a data subblock size of four for a second hash table.

56. Apparatus for compressing a stream of input data into a compressed stream of output data comprising:
(a) maintaining multiple hash tables, each respectively for a different data subblock size, and each hash table having entries having respective hash keys,
(b) means for hashing a string of input characters of the input data for each of the different data subblock sizes to obtain the hash keys, and means for using these hash keys to address hash table entries containing hash information to facilitate location of string matches,
(c) means for hashing, for each of the subblock sizes, subsequent strings of data and searching for a match of prior strings related to the information addressed by hash keys in at least one of the hashing tables,
(d) if a hash match occurs in at least one hash table, means for outputting the subsequent occurrence of the string as compressed data, and if a hash match for each of the subblocks does not occur in any hash table, means for outputting at least the first character of an input subblock as uncompressed data, and
(e) means for determining at least part of hash key for one of the hash tables from the hash key of the second of the hash tables.

57. Apparatus as claimed in claim 56 including means wherein the hash key for a first hash table is determined on a first data subblock size relative to hash keys for a second hash table, and means for obtaining the hashed keys for the first subblock size at least in part from data from the second hash table keys.

58. Apparatus for compressing a steam of input data into a compressed stream of output data comprising:
(a) maintaining multiple hash tables, each respectively for a different data subblock size, and each hash table having entries having respective hash keys,
(b) means for hashing a string of input characters of the input data for each of the different data subblock sizes to obtain the hash keys, and means for using these hash keys to address hash table entries containing hash information to facilitate location of string matches,
(c) means for hashing, for each of the subblock sizes, subsequent strings of data and searching for a match of prior strings related to the information addressed by hash keys in at least one of the hashing tables,
(d) if a hash match occurs in at least one hash table, means for outputting the subsequent occurrence of the string as compressed data, and if a hash match for each of the subblocks does not occur in any hash table, means for outputting at least the first character of an input subblock as uncompressed data, and
(e) means, when a hatch match occurs for different tables, for selecting a larger subblock size for the compressed data output of step (d).

59. Apparatus as claimed in claim 58 including means in the hash table for storing selectively only a source pointer to prior hashed subblocks or the source pointer representative of the prior hashed subblocks and additional information.

60. Apparatus as claimed in claim 58 including means whereby selectively one or multiple of the hash table entries contain selectively only a source pointer to prior hashed subblocks or a source pointer to prior hashed subblocks and additional data.

61. Apparatus as claimed in claim 58 including means for effecting hashing on a data subblock size of three for a first hash table and a data subblock size of four for a second hash table.

62. Apparatus for compressing a stream of input data into a compressed string of output data comprising:
   (a) maintaining multiple hash tables, each respectively for a different data subblock size, and each hash table having entries having respective hash keys,
   (b) means for hashing a string of input characters of the input data for each of the different data subblock sizes to obtain the hash keys, and using these hash keys to address hash table entries containing hash information to facilitate location of string matches,
   (c) means for hashing, for each of the subblock sizes, subsequent strings of data and searching for a match of prior strings related to the information addressed by hash keys in at least one of the hashing tables,
   (d) if a hash match occurs in at least one hash table, means for outputting the subsequent occurrence of the string as compressed data, and if a hash match for each of the subblocks does not occur in any hash table, means for outputting at least the first character of an input subblock as uncompressed data, and
   (e) wherein where a hash match occurs for more than one of the hash tables, means for determining the longer match length of the string of input data for each respective hash table, and means for outputting the longer match length as the compressed data output of step (d).

63. Apparatus for compressing a stream of input data into a compressed string of output data comprising:
   (a) maintaining multiple hash tables, each respectively for a different data subblock size, and each hash table having entries having respective hash keys,
   (b) means for hashing a string of input characters of the input data for each of the different data subblock sizes to obtain the hash keys, and using these hash keys to address hash table entries containing hash information to facilitate location of string matches,
   (c) means for hashing, for each of the subblock sizes, subsequent strings of data and searching for a match of prior strings related to the information addressed by hash keys in at least one of the hashing tables,
   (d) if a hash match occurs in at least one hash table, means for outputting the subsequent occurrence of the string as compressed data, and if a hash match for each of the subblocks does not occur in any hash table, means for outputting at least the first character of an input subblock as uncompressed data,
   (e) wherein where a hash match occurs in a table related to a larger subblock size relative to a hash match in a table related to a smaller subblock size, means for selecting the hash match of the larger subblock size for the compressed data output of step (d), and
   (f) wherein when the one subblock size is larger than the second subblock size, means for computing hash keys for the larger subblock size, using at least part of the value of hash keys from the smaller subblock size.

64. Apparatus for compressing a stream of input data into a compressed string of output data comprising:
   (a) maintaining multiple hash tables, each respectively for a different data subblock size, and each hash table having entries having respective hash keys,
   (b) means for hashing a string of input characters of the input data for each of the different data subblock sizes to obtain the hash keys, and using these hash keys to address hash table entries containing hash information to facilitate location of string matches,
   (c) means for hashing, for each of the subblock sizes, subsequent strings of data and searching for a match of prior strings related to the information addressed by hash keys in at least one of the hashing tables,
   (d) if a hash match occurs in at least one hash table, means for outputting the subsequent occurrence of the string as compressed data, and if a hash match for each of the subblocks does not occur in any hash table, means for outputting at least the first character of an input subblock as uncompressed data, and
   (e) wherein when a larger subblock size does not match on a minimum match length, means for selecting the smaller subblock size hash match if such smaller subblock value matches.

65. Apparatus as claimed in claim 62 including means in the hash table for storing selectively only a source pointer to prior hashed subblocks or the source pointer representative of the prior hashed subblocks and additional information.

66. Apparatus as claimed in claim 62 including means whereby selectively one or multiple of the hash table entries contain selectively only a source pointer to prior hashed subblocks or a source pointer to prior hashed subblocks and additional data.

67. Apparatus as claimed in claim 62 including means whereby hashed information in the hash entries in the hash tables are selectively unconditionally replaced, or conditionally replaced or removed on the occurrence of subsequent hashed data being directed by a key to the hash table entry containing information representative of prior hashed subblocks.

68. Apparatus as claimed in claim 62 including means for effecting hashing on a data subblock size of three for a first hash table and a data subblock size of four for a second hash table.

69. Apparatus as claimed in claim 63 including means in the hash table for storing selectively only a source pointer to prior hashed subblocks or the source pointer representative of the prior hashed subblocks and additional information.

70. Apparatus as claimed in claim 63 including means whereby selectively one or multiple of the hash table entries contain selectively only a source pointer to prior hashed subblocks or a source pointer to prior hashed subblocks and additional data.

71. Apparatus as claimed in claim 63 including means whereby hashed information in the hash entries in the hash tables are selectively unconditionally replaced, or conditionally replaced or removed on the occurrence of subsequent hashed data being directed by a key to the hash table entry containing information representative of prior hashed subblocks.

72. Apparatus as claimed in claim 63 including means for effecting hashing on a data subblock size of three for a first hash table and a data subblock size of four for a second hash table.

73. Apparatus for compressing a stream of input data into a compressed string of output data comprising:
   (a) maintaining multiple hash tables, each respectively for a different data subblock size, and each hash table having entries having respective hash keys,
   (b) means for hashing a string of input characters of the input data for each of the different data subblock sizes to obtain the hash keys, and using these hash keys to address hash table entries containing hash information to facilitate location of string matches,
   (c) means for hashing, for each of the subblock sizes, subsequent strings of data and searching for a match of prior strings related to the information addressed by hash keys in at least one of the hashing tables,
   (d) if a hash match occurs in at least one hash table, means for outputting the subsequent occurrence of the string as compressed data, and if a hash match for each of the subblocks does not occur in any hash table, means for outputting at least the first character of an input subblock as uncompressed data, and
   (e) when a hash miss occurs in at least one of the hash tables, means for effecting hashing for an increased subblock size for the hash table, by employing hash keys from the hash miss whereby a reduced number of operations is required for hashing.

74. Apparatus as claimed in claim 73 including means for transferring a value of hash key from the hashing for one hash table at least in part into the value of a hash key for the second hash table.

75. Apparatus as claimed in claim 73 including means for obtaining a value of a hashing key from the hash miss for use for obtaining the value of the hash key from the same hash table.

76. Apparatus as claimed in claim 73 including means in the hash table for storing selectively only a source pointer to prior hashed data, or the source pointer representative of the prior hashed data and additional information.

77. Apparatus as claimed in claim 73 including means whereby selectively one or both of the hash tables contain selectively only a source pointer to prior hashed data, or a source pointer to prior hashed data and additional information.

78. Apparatus as claimed in claim 73 wherein information stored in entries in the hash tables and wherein the information in the entries in at least one of the hash tables is selectively unconditionally replaced, or conditionally replaced or removed on the occurrence of subsequent hash keys being directed to an entry in the hash table containing information representative of prior hashed data.

79. Apparatus for compressing a stream of input data into a compressed stream of output data comprising:
   (a) maintaining multiple hash tables, each respectively for a different data subblock size, and each hash table having entries having respective hash keys,
   (b) means for hashing a string of input characters of the input data for each of the different data subblock sizes to obtain the hash keys, and using these hash keys to address hash table entries containing hash information to facilitate location of string matches,
   (c) means for hashing, for each of the subblock sizes, subsequent strings of data and searching for a match of prior strings related to the information addressed by hash keys in at least one of the hashing tables,
   (d) if a hash match occurs in at least one hash table, means for outputting the subsequent occurrence of the string as compressed data, and if a hash match for each of the subblocks does not occur in any hash table, means for outputting at least the first character of an input subblock as uncompressed data, and
   (e) wherein, when a hash match occurs in a table related to a larger subblock size relative to a hash match and a table related to a smaller subblock size, means for selectively applying the hash match from either the larger subblock size or the smaller subblock size.

80. Apparatus as claimed in claim 79 including means in the hash table for storing selectively only a source pointer to prior hashed subblocks or the source pointer representative of the prior hashed subblocks and additional information.

81. Apparatus as claimed in claim 79 including means whereby selectively one or multiple of the hash table entries contain selectively only a source pointer to prior hashed subblocks or a source pointer to prior hashed subblocks and additional data.

82. Apparatus as claimed in claim 79 including means for effecting hashing on a data subblock size of three for a first hash table and a data subblock size of four for a second hash table.

83. Apparatus as claimed in claim 79 wherein when a hash miss occurs, the key of the hash miss is used in the subsequent hashing by the step of at least one computation being a simple shift, or a computation being an exclusive OR.

84. Apparatus for compressing a stream of input data into a compressed string of output data comprising:
   (a) maintaining multiple hash tables, each respectively for a different data subblock size, and each hash table having entries having respective hash keys,
   (b) means for hashing a string of input characters of the input data for each of the different data subblock sizes to obtain the hash keys, and using these hash keys to address hash table entries containing hash information to facilitate location of string matches,
   (c) means for hashing, for each of the subblock sizes, subsequent strings of data and searching for a match of prior strings related to the information addressed by hash keys in at least one of the hashing tables,
   (d) if a hash match occurs, means for compressing and outputting the subsequent occurrence of the string as compressed data, and if a hash miss occurs, means for outputting such data as uncompressed data, and
   (e) when a hash miss occurs in the hash table, means for effecting hashing for a next key for the hash table, by employing hash keys from the hash miss whereby a reduced number of operations is required for hashing.

85. Apparatus as claimed in claim 84 including means for maintaining multiple hash tables, each for a different subblock size and means for applying the key from a hash miss of each respective table to the next key of a hash table.

86. A generator for hashing a stream of input data comprising:
(a) interfaces to multiple hash tables designating a different data subblock size for each hash table,
(b) means for hashing strings of input characters of the input data for each of the different data subblock sizes to produce hash keys, and means for entering the hash information into hash entries of the hash table addressed by hash keys,
(c) means for producing multiple hash keys for each of the subblock sizes, and
(d) means for producing a hash key for a first subblock size from a hash key of a second subblock size.

87. A hash generator as claimed in claim 86 wherein there are two hash tables, and wherein a smaller subblock size is designated for a first hash table and a larger subblock size designated for a second hash table.

88. A generator as claimed in claim 86 comprising means for producing hash keys for a larger subblock size from hash keys of smaller subblock size.

89. A generator for hashing a stream of data comprising:
(a) interface means to a hash table with a designated input data subblock size for the hash table, and the hash table having hash keys,
(b) means for hashing strings of input characters of the input data for each input data subblocks, and means for entering the hashed information into hash entries of the hash table addressed by the hash keys, and
(c) means for producing a next hash key from a prior hash key on occurrence of a hash miss.

90. A generator as claimed in claim 89 wherein there are interface means respectively to multiple hash tables, and wherein a first subblock size is designated for a first hash table and a different subblock size is designated for a second hash table.

91. A generator as claimed in claim 89 wherein there are at least two different data subblock sizes and including means for providing a hash key for a first subblock size from a prior hash key of a second subblock size.

* * * * *

UNITED STATES PATENT AND TRADEMARK OFFICE
CERTIFICATE OF CORRECTION

PATENT NO. : 5,371,499

DATED : December 6, 1994

INVENTOR(S) : Graybill et al

It is certified that error appears in the above-indentified patent and that said Letters Patent is hereby corrected as shown below:

Title page, item [75] inventors, after "Quartz Hill" delete ";" and insert —,both of Calif.— therfor;after "Gibson" delete "Harbor City, all of Calif." and insert —Coupeville, WA— therefor.

Column 3, lines 6, 8 and 23, delete "outputted" and insert —output— therefor.

Column 4, line 18, delete "Fig." and insert —Figs.— therefor.

Column 5, line 15, delete "outputted" and insert —output— therefor.

Column 8, line 5, delete "(j)" and insert —(J)— therefor.

Column 11, line 2, delete "6" and insert —16— therefor.

Column 12, line 45, delete "a" and insert —the— therefor.

Column 13, line 12, delete dash sign "-" and insert period —.— therefor.

Column 19, line 27, claim 34, after the word "of" insert —the—; line 53, claim 39, delete "east" and insert —least— therefor.

UNITED STATES PATENT AND TRADEMARK OFFICE
CERTIFICATE OF CORRECTION

PATENT NO. : 5,371,499
DATED : December 6, 1994
INVENTOR(S) : Graybill et al

It is certified that error appears in the above-indentified patent and that said Letters Patent is hereby corrected as shown below:

Column 22, line 21, claim 56(e), after the word "of" insert --a--; line 54, claim 58(e), delete "hatch" and insert --hash-- therefor.

Signed and Sealed this

Seventeenth Day of October, 1995

*Attest:*

BRUCE LEHMAN

*Attesting Officer*   *Commissioner of Patents and Trademarks*